US008617989B2

(12) United States Patent
Sapre et al.

(10) Patent No.: US 8,617,989 B2
(45) Date of Patent: Dec. 31, 2013

(54) LINER PROPERTY IMPROVEMENT

(75) Inventors: Kedar Sapre, San Jose, CA (US); Manuel Hernandez, Santa Clara, CA (US); Lei Luo, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 46 days.

(21) Appl. No.: 13/451,207

(22) Filed: Apr. 19, 2012

(65) Prior Publication Data
US 2013/0102149 A1  Apr. 25, 2013

Related U.S. Application Data

(60) Provisional application No. 61/539,294, filed on Sep. 26, 2011.

(51) Int. Cl.
*H01L 21/316* (2006.01)
*H01L 23/538* (2006.01)

(52) U.S. Cl.
USPC .... 438/667; 438/763; 438/784; 257/E21.275; 257/E21.597

(58) Field of Classification Search
USPC .................. 257/E23.067, E23.174, E21.275, 257/E21.597; 438/667, 763, 784
See application file for complete search history.

(56) References Cited

U.S. PATENT DOCUMENTS

| 4,147,571 | A | 4/1979 | Stringfellow et al. |
| 4,200,666 | A | 4/1980 | Reinberg |
| 4,816,098 | A | 3/1989 | Davis et al. |
| 4,818,326 | A | 4/1989 | Liu et al. |
| 4,910,043 | A | 3/1990 | Freeman et al. |
| 4,931,354 | A | 6/1990 | Wakino et al. |
| 4,946,593 | A | 8/1990 | Pinigis |
| 5,016,332 | A | 5/1991 | Reichelderfer et al. |
| 5,110,407 | A | 5/1992 | Ono et al. |

(Continued)

FOREIGN PATENT DOCUMENTS

| DE | 19654737 A1 | 7/1997 |
| EP | 0892083 A1 | 1/1999 |

(Continued)

OTHER PUBLICATIONS

Alexandrov, S. E., et al., "Formation of Silicon Nitride Films by Remote Plasma-enhanced Chemical Vapour Deposition". Advanced Materials for Optics and Electronics, vol. 2, 301-312 (1993).

(Continued)

*Primary Examiner* — George Fourson, III
(74) *Attorney, Agent, or Firm* — Kilpatrick Townsend & Stockton LLP

(57) ABSTRACT

Methods of forming a dielectric liner layer on a semiconductor substrate are described. The method may include flowing a phosphorus-containing precursor with a silicon-containing precursor and an oxygen-containing precursor over the substrate to deposit a dielectric material. The dielectric material may be deposited along a field region and within at least one via on the substrate having a depth of at least 1 μm. The method may also include forming a liner layer within the via with the dielectric material. The liner may include a silicon oxide doped with phosphorus, and the thickness of the liner layer at an upper portion of the via sidewall may be less than about 5 times the thickness of the liner layer at a lower portion of the via sidewall.

20 Claims, 9 Drawing Sheets

(56) References Cited

U.S. PATENT DOCUMENTS

| | | |
|---|---|---|
| 5,212,119 A | 5/1993 | Hah et al. |
| 5,271,972 A | 12/1993 | Kwok et al. |
| 5,279,784 A | 1/1994 | Bender et al. |
| 5,393,708 A | 2/1995 | Hsia et al. |
| 5,426,076 A | 6/1995 | Moghadam |
| 5,434,109 A | 7/1995 | Geissler et al. |
| 5,468,687 A | 11/1995 | Carl et al. |
| 5,485,420 A | 1/1996 | Lage et al. |
| 5,530,293 A | 6/1996 | Cohen et al. |
| 5,547,703 A | 8/1996 | Camilletti et al. |
| 5,558,717 A | 9/1996 | Zhao et al. |
| 5,578,532 A | 11/1996 | van de Ven et al. |
| 5,587,014 A | 12/1996 | Iyechika et al. |
| 5,593,741 A | 1/1997 | Ikeda |
| 5,620,525 A | 4/1997 | van de Ven et al. |
| 5,622,784 A | 4/1997 | Okaue et al. |
| 5,635,409 A | 6/1997 | Moslehi |
| 5,665,643 A | 9/1997 | Shin |
| 5,691,009 A | 11/1997 | Sandhu |
| 5,769,951 A | 6/1998 | van de Ven et al. |
| 5,786,263 A | 7/1998 | Perera |
| 5,811,325 A | 9/1998 | Lin et al. |
| 5,843,233 A | 12/1998 | van de Ven et al. |
| 5,853,607 A | 12/1998 | Zhao et al. |
| 5,882,417 A | 3/1999 | van de Ven et al. |
| 5,925,411 A | 7/1999 | van de Ven et al. |
| 5,935,340 A | 8/1999 | Xia et al. |
| 5,937,308 A | 8/1999 | Gardner et al. |
| 5,937,323 A | 8/1999 | Orczyk et al. |
| 5,966,595 A | 10/1999 | Thakur et al. |
| 6,008,515 A | 12/1999 | Hsia et al. |
| 6,009,830 A | 1/2000 | Li et al. |
| 6,014,979 A | 1/2000 | Van Autryve et al. |
| 6,017,791 A | 1/2000 | Wang et al. |
| 6,024,044 A | 2/2000 | Law et al. |
| 6,087,243 A | 7/2000 | Wang |
| 6,090,442 A | 7/2000 | Klaus et al. |
| 6,090,723 A | 7/2000 | Thakur et al. |
| 6,114,219 A | 9/2000 | Spikes, Jr. et al. |
| 6,121,130 A | 9/2000 | Chua et al. |
| 6,140,242 A | 10/2000 | Oh et al. |
| 6,146,970 A | 11/2000 | Witek et al. |
| 6,150,286 A | 11/2000 | Sun et al. |
| 6,156,394 A | 12/2000 | Yamasaki et al. |
| 6,156,581 A | 12/2000 | Vaudo et al. |
| 6,165,834 A | 12/2000 | Agarwal et al. |
| 6,180,490 B1 | 1/2001 | Vassiliev et al. |
| 6,187,682 B1 | 2/2001 | Denning et al. |
| 6,191,004 B1 | 2/2001 | Hsiao |
| 6,207,587 B1 | 3/2001 | Li et al. |
| 6,211,040 B1 * | 4/2001 | Liu et al. ............. 438/424 |
| 6,258,690 B1 | 7/2001 | Zenke |
| 6,287,962 B1 | 9/2001 | Lin |
| 6,302,964 B1 | 10/2001 | Umotoy et al. |
| 6,355,581 B1 * | 3/2002 | Vassiliev et al. ............. 438/789 |
| 6,383,954 B1 | 5/2002 | Wang et al. |
| 6,387,207 B1 | 5/2002 | Janakiraman et al. |
| 6,406,677 B1 | 6/2002 | Carter et al. |
| 6,413,583 B1 | 7/2002 | Moghadam et al. |
| 6,448,187 B2 | 9/2002 | Yau et al. |
| 6,469,283 B1 | 10/2002 | Burkhart et al. |
| 6,503,557 B1 | 1/2003 | Joret |
| 6,506,253 B2 | 1/2003 | Sakuma |
| 6,508,879 B1 | 1/2003 | Hashimoto |
| 6,509,283 B1 | 1/2003 | Thomas |
| 6,524,931 B1 | 2/2003 | Perera |
| 6,528,332 B2 | 3/2003 | Mahanpour et al. |
| 6,544,900 B2 | 4/2003 | Raaijmakers et al. |
| 6,548,416 B2 | 4/2003 | Han et al. |
| 6,548,899 B2 | 4/2003 | Ross |
| 6,559,026 B1 | 5/2003 | Rossman et al. |
| 6,566,278 B1 | 5/2003 | Harvey et al. |
| 6,583,063 B1 | 6/2003 | Khan et al. |
| 6,583,069 B1 * | 6/2003 | Vassiliev et al. ............. 438/778 |
| 6,589,868 B2 | 7/2003 | Rossman |
| 6,596,654 B1 | 7/2003 | Bayman et al. |
| 6,599,839 B1 | 7/2003 | Gabriel et al. |
| 6,602,806 B1 | 8/2003 | Xia et al. |
| 6,614,181 B1 | 9/2003 | Harvey et al. |
| 6,624,064 B1 | 9/2003 | Sahin et al. |
| 6,630,413 B2 | 10/2003 | Todd |
| 6,645,303 B2 | 11/2003 | Frankel et al. |
| 6,656,804 B2 | 12/2003 | Tsujikawa et al. |
| 6,660,391 B1 | 12/2003 | Rose et al. |
| 6,667,553 B2 | 12/2003 | Cerny et al. |
| 6,670,284 B2 | 12/2003 | Yin |
| 6,676,751 B2 | 1/2004 | Solomon et al. |
| 6,682,659 B1 | 1/2004 | Cho et al. |
| 6,682,969 B1 | 1/2004 | Basceri et al. |
| 6,683,364 B2 | 1/2004 | Oh et al. |
| 6,706,634 B1 | 3/2004 | Seitz et al. |
| 6,716,770 B2 | 4/2004 | O'Neill et al. |
| 6,756,085 B2 | 6/2004 | Waldfried et al. |
| 6,762,126 B2 | 7/2004 | Cho et al. |
| 6,787,191 B2 | 9/2004 | Hanahata et al. |
| 6,794,290 B1 | 9/2004 | Papasouliotis et al. |
| 6,800,571 B2 | 10/2004 | Cheung et al. |
| 6,818,517 B1 | 11/2004 | Maes |
| 6,819,886 B2 | 11/2004 | Runkowske et al. |
| 6,830,624 B2 | 12/2004 | Janakiraman et al. |
| 6,833,052 B2 | 12/2004 | Li et al. |
| 6,833,322 B2 | 12/2004 | Anderson et al. |
| 6,835,278 B2 | 12/2004 | Selbrede et al. |
| 6,849,520 B2 | 2/2005 | Kim et al. |
| 6,858,523 B2 | 2/2005 | DeBoer et al. |
| 6,858,533 B2 | 2/2005 | Chu et al. |
| 6,867,086 B1 | 3/2005 | Chen et al. |
| 6,872,323 B1 | 3/2005 | Entley et al. |
| 6,875,687 B1 | 4/2005 | Weidman et al. |
| 6,890,403 B2 | 5/2005 | Cheung et al. |
| 6,900,067 B2 | 5/2005 | Kobayashi et al. |
| 6,955,836 B2 | 10/2005 | Kumagai et al. |
| 6,958,112 B2 | 10/2005 | Karim et al. |
| 7,018,902 B2 | 3/2006 | Visokay et al. |
| 7,077,904 B2 | 7/2006 | Cho et al. |
| 7,084,076 B2 | 8/2006 | Park et al. |
| 7,087,497 B2 | 8/2006 | Yuan et al. |
| 7,109,114 B2 | 9/2006 | Chen et al. |
| 7,115,419 B2 | 10/2006 | Suzuki |
| 7,122,222 B2 | 10/2006 | Xiao et al. |
| 7,129,185 B2 | 10/2006 | Aoyama et al. |
| 7,148,155 B1 | 12/2006 | Tarafdar et al. |
| 7,176,144 B1 | 2/2007 | Wang et al. |
| 7,183,177 B2 | 2/2007 | Al-Bayati et al. |
| 7,192,626 B2 | 3/2007 | Dussarrat et al. |
| 7,205,248 B2 | 4/2007 | Li et al. |
| 7,220,461 B2 | 5/2007 | Hasebe et al. |
| 7,297,608 B1 | 11/2007 | Papasouliotis et al. |
| 7,335,609 B2 | 2/2008 | Ingle et al. |
| 7,399,388 B2 | 7/2008 | Moghadam et al. |
| 7,419,903 B2 | 9/2008 | Haukka et al. |
| 7,435,661 B2 | 10/2008 | Miller et al. |
| 7,456,116 B2 | 11/2008 | Ingle et al. |
| 7,498,273 B2 | 3/2009 | Mallick et al. |
| 7,514,375 B1 | 4/2009 | Shanker et al. |
| 7,521,378 B2 | 4/2009 | Fucsko et al. |
| 7,524,735 B1 | 4/2009 | Gauri et al. |
| 7,524,750 B2 | 4/2009 | Nemani et al. |
| 7,541,297 B2 | 6/2009 | Mallick et al. |
| 7,745,352 B2 | 6/2010 | Mallick et al. |
| 7,749,574 B2 | 7/2010 | Mahajani et al. |
| 7,790,634 B2 | 9/2010 | Munro et al. |
| 7,803,722 B2 | 9/2010 | Liang |
| 7,825,038 B2 | 11/2010 | Ingle et al. |
| 7,825,044 B2 | 11/2010 | Mallick et al. |
| 7,867,923 B2 | 1/2011 | Mallick et al. |
| 7,902,080 B2 | 3/2011 | Chen et al. |
| 7,935,643 B2 | 5/2011 | Liang et al. |
| 7,943,514 B2 * | 5/2011 | West ............. 438/667 |
| 7,943,531 B2 | 5/2011 | Nemani et al. |
| 7,989,365 B2 | 8/2011 | Park et al. |
| 7,994,019 B1 | 8/2011 | Kweskin et al. |
| 8,119,544 B2 | 2/2012 | Hasebe et al. |
| 8,129,555 B2 | 3/2012 | Cheng et al. |

(56) References Cited

U.S. PATENT DOCUMENTS

| | | |
|---|---|---|
| 8,232,176 B2 | 7/2012 | Lubomirsky et al. |
| 8,236,708 B2 | 8/2012 | Kweskin et al. |
| 8,242,031 B2 | 8/2012 | Mallick et al. |
| 8,264,066 B2 * | 9/2012 | Lo et al. ............... 257/621 |
| 8,304,351 B2 | 11/2012 | Wang et al. |
| 8,318,584 B2 | 11/2012 | Li et al. |
| 2001/0021595 A1 | 9/2001 | Jang |
| 2001/0029114 A1 | 10/2001 | Vulpio et al. |
| 2001/0038919 A1 | 11/2001 | Berry et al. |
| 2001/0042511 A1 | 11/2001 | Liu et al. |
| 2001/0048980 A1 | 12/2001 | Kishimoto et al. |
| 2001/0054387 A1 | 12/2001 | Frankel et al. |
| 2001/0055889 A1 | 12/2001 | Iyer |
| 2002/0048969 A1 | 4/2002 | Suzuki et al. |
| 2002/0068416 A1 | 6/2002 | Hsieh et al. |
| 2002/0068466 A1 | 6/2002 | Lee et al. |
| 2002/0079523 A1 | 6/2002 | Zheng et al. |
| 2002/0081817 A1 | 6/2002 | Bhakta et al. |
| 2002/0081842 A1 * | 6/2002 | Sambucetti et al. ......... 438/678 |
| 2002/0086166 A1 | 7/2002 | Hendricks et al. |
| 2002/0127350 A1 | 9/2002 | Ishikawa et al. |
| 2002/0129769 A1 | 9/2002 | Kim et al. |
| 2002/0142585 A1 | 10/2002 | Mandal |
| 2002/0146879 A1 | 10/2002 | Fu et al. |
| 2002/0164429 A1 | 11/2002 | Gaillard et al. |
| 2002/0164891 A1 | 11/2002 | Gates et al. |
| 2002/0177298 A1 | 11/2002 | Konishi et al. |
| 2002/0182893 A1 | 12/2002 | Ballantine et al. |
| 2003/0001201 A1 | 1/2003 | Yuzuriha et al. |
| 2003/0023113 A1 | 1/2003 | Druzkowski et al. |
| 2003/0040199 A1 | 2/2003 | Agarwal |
| 2003/0064154 A1 | 4/2003 | Laxman et al. |
| 2003/0077918 A1 | 4/2003 | Wu et al. |
| 2003/0113992 A1 | 6/2003 | Yau et al. |
| 2003/0118748 A1 | 6/2003 | Kumagai et al. |
| 2003/0124873 A1 | 7/2003 | Xing et al. |
| 2003/0143841 A1 | 7/2003 | Yang et al. |
| 2003/0159656 A1 | 8/2003 | Tan et al. |
| 2003/0172872 A1 | 9/2003 | Thakur et al. |
| 2003/0194881 A1 | 10/2003 | Totsuka et al. |
| 2003/0199151 A1 | 10/2003 | Ho et al. |
| 2003/0203653 A1 | 10/2003 | Buchanan et al. |
| 2003/0207561 A1 * | 11/2003 | Dubin et al. ............... 438/630 |
| 2003/0232495 A1 | 12/2003 | Moghadam et al. |
| 2004/0008334 A1 | 1/2004 | Sreenivasan et al. |
| 2004/0020601 A1 | 2/2004 | Zhao et al. |
| 2004/0029352 A1 | 2/2004 | Beyer et al. |
| 2004/0029353 A1 | 2/2004 | Zheng et al. |
| 2004/0048492 A1 | 3/2004 | Ishikawa et al. |
| 2004/0065253 A1 | 4/2004 | Tois et al. |
| 2004/0079118 A1 | 4/2004 | M'Saad et al. |
| 2004/0082131 A1 | 4/2004 | Tsujikawa et al. |
| 2004/0110354 A1 | 6/2004 | Natzle et al. |
| 2004/0139983 A1 | 7/2004 | Lakshmanan et al. |
| 2004/0146661 A1 | 7/2004 | Kapoor et al. |
| 2004/0152342 A1 | 8/2004 | Li et al. |
| 2004/0161899 A1 | 8/2004 | Luo et al. |
| 2004/0166680 A1 | 8/2004 | Miyajima et al. |
| 2004/0175501 A1 | 9/2004 | Lukas et al. |
| 2004/0180557 A1 | 9/2004 | Park et al. |
| 2004/0185641 A1 | 9/2004 | Tanabe et al. |
| 2004/0194706 A1 | 10/2004 | Wang et al. |
| 2004/0197843 A1 | 10/2004 | Chou et al. |
| 2004/0216844 A1 | 11/2004 | Janakiraman et al. |
| 2004/0219780 A1 | 11/2004 | Ohuchi |
| 2004/0224534 A1 | 11/2004 | Beulens et al. |
| 2004/0231590 A1 | 11/2004 | Ovshinsky |
| 2004/0241342 A1 | 12/2004 | Karim et al. |
| 2004/0253826 A1 * | 12/2004 | Ivanov et al. ............... 438/710 |
| 2005/0001556 A1 | 1/2005 | Hoffman et al. |
| 2005/0014354 A1 | 1/2005 | Ozawa et al. |
| 2005/0019494 A1 | 1/2005 | Moghadam et al. |
| 2005/0026443 A1 | 2/2005 | Goo et al. |
| 2005/0062165 A1 | 3/2005 | Saenger et al. |
| 2005/0087140 A1 | 4/2005 | Yuda et al. |
| 2005/0118794 A1 | 6/2005 | Babayan et al. |
| 2005/0121145 A1 | 6/2005 | Du Bois et al. |
| 2005/0142895 A1 | 6/2005 | Ingle et al. |
| 2005/0153574 A1 | 7/2005 | Mandal |
| 2005/0160974 A1 * | 7/2005 | Ivanov et al. ............... 118/50 |
| 2005/0181555 A1 | 8/2005 | Haukka et al. |
| 2005/0186731 A1 | 8/2005 | Derderian et al. |
| 2005/0186789 A1 | 8/2005 | Agarwal |
| 2005/0196533 A1 | 9/2005 | Hasebe et al. |
| 2005/0196935 A1 | 9/2005 | Ishitsuka et al. |
| 2005/0196977 A1 | 9/2005 | Saito et al. |
| 2005/0224866 A1 | 10/2005 | Higashi et al. |
| 2005/0227017 A1 | 10/2005 | Senzaki et al. |
| 2005/0227499 A1 | 10/2005 | Park et al. |
| 2005/0230350 A1 | 10/2005 | Kao et al. |
| 2005/0233595 A1 | 10/2005 | Choi et al. |
| 2005/0250340 A1 | 11/2005 | Chen et al. |
| 2005/0257890 A1 | 11/2005 | Park et al. |
| 2005/0260347 A1 | 11/2005 | Narwankar et al. |
| 2005/0287775 A1 | 12/2005 | Hasebe et al. |
| 2006/0011984 A1 | 1/2006 | Curie |
| 2006/0014399 A1 | 1/2006 | Joe |
| 2006/0030151 A1 | 2/2006 | Ding et al. |
| 2006/0030165 A1 | 2/2006 | Ingle et al. |
| 2006/0046427 A1 | 3/2006 | Ingle et al. |
| 2006/0046506 A1 | 3/2006 | Fukiage |
| 2006/0055004 A1 | 3/2006 | Gates et al. |
| 2006/0068599 A1 | 3/2006 | Baek et al. |
| 2006/0075966 A1 | 4/2006 | Chen et al. |
| 2006/0088985 A1 | 4/2006 | Haverkort et al. |
| 2006/0090694 A1 | 5/2006 | Cho et al. |
| 2006/0091104 A1 | 5/2006 | Takeshita et al. |
| 2006/0096540 A1 | 5/2006 | Choi |
| 2006/0102977 A1 | 5/2006 | Fucsko et al. |
| 2006/0105106 A1 | 5/2006 | Balseanu et al. |
| 2006/0110939 A1 | 5/2006 | Joshi et al. |
| 2006/0110943 A1 | 5/2006 | Swerts et al. |
| 2006/0121394 A1 | 6/2006 | Chi |
| 2006/0159847 A1 | 7/2006 | Porter et al. |
| 2006/0162661 A1 | 7/2006 | Jung et al. |
| 2006/0178018 A1 | 8/2006 | Olsen |
| 2006/0223315 A1 | 10/2006 | Yokota et al. |
| 2006/0228903 A1 | 10/2006 | McSwiney et al. |
| 2006/0252240 A1 | 11/2006 | Gschwandtner et al. |
| 2006/0263522 A1 | 11/2006 | Byun |
| 2006/0281496 A1 | 12/2006 | Cedraeus |
| 2006/0286774 A1 | 12/2006 | Singh et al. |
| 2006/0286776 A1 | 12/2006 | Ranish et al. |
| 2007/0004170 A1 | 1/2007 | Kawasaki et al. |
| 2007/0010072 A1 | 1/2007 | Bailey et al. |
| 2007/0020392 A1 | 1/2007 | Kobrin et al. |
| 2007/0026689 A1 | 2/2007 | Nakata et al. |
| 2007/0031598 A1 | 2/2007 | Okuyama et al. |
| 2007/0031609 A1 | 2/2007 | Kumar et al. |
| 2007/0032054 A1 | 2/2007 | Ramaswamy et al. |
| 2007/0049044 A1 | 3/2007 | Marsh |
| 2007/0065578 A1 | 3/2007 | McDougall |
| 2007/0066022 A1 | 3/2007 | Chen et al. |
| 2007/0077777 A1 | 4/2007 | Gumpher |
| 2007/0092661 A1 | 4/2007 | Ryuzaki et al. |
| 2007/0099438 A1 | 5/2007 | Ye et al. |
| 2007/0108404 A1 | 5/2007 | Stewart et al. |
| 2007/0111546 A1 | 5/2007 | Iyer et al. |
| 2007/0128864 A1 | 6/2007 | Ma et al. |
| 2007/0134433 A1 | 6/2007 | Dussarrat et al. |
| 2007/0166892 A1 | 7/2007 | Hori |
| 2007/0173073 A1 | 7/2007 | Weber |
| 2007/0181966 A1 | 8/2007 | Watatani et al. |
| 2007/0232071 A1 | 10/2007 | Balseanu et al. |
| 2007/0232082 A1 | 10/2007 | Balseanu et al. |
| 2007/0275569 A1 | 11/2007 | Moghadam et al. |
| 2007/0281106 A1 | 12/2007 | Lubomirsky et al. |
| 2007/0281448 A1 | 12/2007 | Chen et al. |
| 2007/0281495 A1 | 12/2007 | Mallick et al. |
| 2007/0281496 A1 | 12/2007 | Ingle et al. |
| 2007/0289534 A1 | 12/2007 | Lubomirsky et al. |
| 2007/0298585 A1 | 12/2007 | Lubomirsky et al. |
| 2008/0000423 A1 | 1/2008 | Fukiage |
| 2008/0014759 A1 | 1/2008 | Chua et al. |

(56) References Cited

U.S. PATENT DOCUMENTS

| | | |
|---|---|---|
| 2008/0026597 A1 | 1/2008 | Munro et al. |
| 2008/0038486 A1 | 2/2008 | Treichel et al. |
| 2008/0063809 A1 | 3/2008 | Lee et al. |
| 2008/0081104 A1 | 4/2008 | Hasebe et al. |
| 2008/0085607 A1 | 4/2008 | Yu et al. |
| 2008/0099431 A1 | 5/2008 | Kumar et al. |
| 2008/0102223 A1 | 5/2008 | Wagner et al. |
| 2008/0102650 A1 | 5/2008 | Adams et al. |
| 2008/0182382 A1 | 7/2008 | Ingle et al. |
| 2008/0188087 A1 | 8/2008 | Chen et al. |
| 2008/0206954 A1 | 8/2008 | Choi et al. |
| 2008/0241358 A1 | 10/2008 | Joe et al. |
| 2008/0260969 A1 | 10/2008 | Dussarrat et al. |
| 2008/0305648 A1 | 12/2008 | Fukazawa et al. |
| 2008/0318429 A1 | 12/2008 | Ozawa et al. |
| 2009/0031953 A1 | 2/2009 | Ingle et al. |
| 2009/0035917 A1 | 2/2009 | Ahn et al. |
| 2009/0053901 A1 | 2/2009 | Goto et al. |
| 2009/0061647 A1 | 3/2009 | Mallick et al. |
| 2009/0075490 A1 | 3/2009 | Dussarrat et al. |
| 2009/0095714 A1 | 4/2009 | Chen et al. |
| 2009/0104755 A1 | 4/2009 | Mallick et al. |
| 2009/0104789 A1 | 4/2009 | Mallick et al. |
| 2009/0104790 A1 | 4/2009 | Liang |
| 2009/0104791 A1 | 4/2009 | Nemani et al. |
| 2009/0104798 A1 | 4/2009 | Hirano |
| 2009/0142935 A1 | 6/2009 | Fukuzawa et al. |
| 2009/0181550 A1 | 7/2009 | Hasebe et al. |
| 2009/0194809 A1 | 8/2009 | Cho |
| 2009/0203225 A1 | 8/2009 | Gates et al. |
| 2009/0209081 A1 | 8/2009 | Matero et al. |
| 2009/0215251 A1 | 8/2009 | Vellaikal et al. |
| 2009/0224374 A1 | 9/2009 | Bhatia et al. |
| 2009/0232985 A1 | 9/2009 | Dussarrat et al. |
| 2009/0242957 A1 | 10/2009 | Ma et al. |
| 2009/0277587 A1 | 11/2009 | Lubomirsky et al. |
| 2009/0280650 A1 | 11/2009 | Lubomirsky et al. |
| 2009/0289284 A1 | 11/2009 | Goh et al. |
| 2009/0294925 A1 | 12/2009 | Lin et al. |
| 2009/0298257 A1 | 12/2009 | Lee et al. |
| 2009/0325391 A1 | 12/2009 | De Vusser et al. |
| 2010/0081094 A1 | 4/2010 | Hasebe et al. |
| 2010/0081293 A1 | 4/2010 | Mallick et al. |
| 2010/0099236 A1* | 4/2010 | Kwon et al. ............... 438/435 |
| 2010/0136313 A1 | 6/2010 | Shimizu et al. |
| 2010/0140756 A1 | 6/2010 | Kozasa et al. |
| 2010/0143609 A1 | 6/2010 | Fukazawa et al. |
| 2010/0184302 A1 | 7/2010 | Lee et al. |
| 2010/0190348 A1 | 7/2010 | Akae et al. |
| 2010/0221428 A1 | 9/2010 | Dussarrat |
| 2010/0221925 A1 | 9/2010 | Lee et al. |
| 2010/0255655 A1 | 10/2010 | Mallick et al. |
| 2010/0261318 A1* | 10/2010 | Feng et al. ............... 438/132 |
| 2010/0283097 A1 | 11/2010 | Endoh et al. |
| 2011/0014798 A1 | 1/2011 | Mallick et al. |
| 2011/0034035 A1 | 2/2011 | Liang et al. |
| 2011/0034039 A1 | 2/2011 | Liang et al. |
| 2011/0045676 A1 | 2/2011 | Park et al. |
| 2011/0111137 A1 | 5/2011 | Liang et al. |
| 2011/0129616 A1 | 6/2011 | Ingle et al. |
| 2011/0136347 A1 | 6/2011 | Kovarsky et al. |
| 2011/0159213 A1 | 6/2011 | Cai et al. |
| 2011/0159703 A1 | 6/2011 | Liang et al. |
| 2011/0165347 A1 | 7/2011 | Miller et al. |
| 2011/0165781 A1 | 7/2011 | Liang et al. |
| 2011/0186990 A1* | 8/2011 | Mawatari et al. ............ 257/737 |
| 2011/0187000 A1* | 8/2011 | West ..................... 257/751 |
| 2011/0217851 A1 | 9/2011 | Liang et al. |
| 2011/0223774 A1 | 9/2011 | Kweskin et al. |
| 2012/0003840 A1 | 1/2012 | Wang et al. |
| 2012/0009802 A1 | 1/2012 | LaVoie et al. |
| 2012/0079982 A1 | 4/2012 | Lubomirsky et al. |
| 2012/0083133 A1 | 4/2012 | Solis et al. |
| 2012/0094468 A1 | 4/2012 | Bhatia et al. |
| 2012/0094476 A1 | 4/2012 | Tanaka et al. |
| 2012/0111831 A1 | 5/2012 | Ha |
| 2012/0142192 A1 | 6/2012 | Li et al. |
| 2012/0145079 A1 | 6/2012 | Lubomirsky et al. |
| 2012/0161405 A1 | 6/2012 | Mohn et al. |
| 2012/0177846 A1 | 7/2012 | Li et al. |
| 2012/0190178 A1 | 7/2012 | Wang et al. |
| 2012/0193778 A1* | 8/2012 | Mawatari ................. 257/737 |
| 2012/0213940 A1 | 8/2012 | Mallick |
| 2012/0225565 A1 | 9/2012 | Bhatia et al. |
| 2012/0238108 A1 | 9/2012 | Chen et al. |
| 2012/0269989 A1 | 10/2012 | Liang et al. |
| 2012/0309205 A1 | 12/2012 | Wang et al. |
| 2013/0062736 A1* | 3/2013 | Brighton et al. ............ 257/621 |
| 2013/0193578 A1* | 8/2013 | Yu et al. ................. 257/751 |

FOREIGN PATENT DOCUMENTS

| | | |
|---|---|---|
| EP | 1095958 B1 | 5/2001 |
| EP | 1717848 A | 11/2006 |
| JP | 61-234534 A | 10/1986 |
| JP | 64-048425 A | 2/1989 |
| JP | 1-198033 A | 8/1989 |
| JP | 01-235259 A | 9/1989 |
| JP | 01241826 A | 9/1989 |
| JP | 03-197684 A | 8/1991 |
| JP | 03-286531 | 12/1991 |
| JP | 05-259156 | 10/1993 |
| JP | 05-304147 A | 11/1993 |
| JP | 06-077150 | 3/1994 |
| JP | 6-168930 A | 6/1994 |
| JP | 07-014826 A | 1/1995 |
| JP | 07-169762 A | 7/1995 |
| JP | 07-316823 A | 12/1995 |
| JP | 08-236518 A | 9/1996 |
| JP | 08-288286 A | 11/1996 |
| JP | 09-237785 A | 9/1997 |
| JP | 10-163183 A | 6/1998 |
| JP | 11-274285 A | 10/1999 |
| JP | 2001-148382 A | 5/2001 |
| JP | 2002-370059 A | 12/2002 |
| JP | 2004-327639 | 11/2004 |
| JP | 2005-142448 A | 6/2005 |
| JP | 2005-268396 A | 9/2005 |
| JP | 2005-302848 A | 10/2005 |
| JP | 2008-159824 A | 7/2008 |
| JP | 2008/218684 A | 9/2008 |
| JP | 2011-220127 A | 11/2011 |
| KR | 10-2004-0091978 A | 11/2004 |
| KR | 1020040104533 A | 12/2004 |
| KR | 10-2005-0003758 A | 1/2005 |
| KR | 10-2005-0094183 A | 9/2005 |
| KR | 1020060081350 A | 7/2006 |
| KR | 10-2009-0011765 A | 2/2009 |
| KR | 10-2009-0122860 A | 12/2009 |
| TW | 200514163 | 4/2005 |
| TW | 200707582 | 2/2007 |
| WO | 02/077320 A1 | 10/2002 |
| WO | 03/066933 A | 8/2003 |
| WO | 2005/078784 A | 8/2005 |
| WO | 2007/040856 A2 | 4/2007 |
| WO | 2007/140376 A | 12/2007 |
| WO | 2007/140424 A | 12/2007 |
| WO | 2009/055340 A1 | 4/2009 |
| WO | 2012/145148 | 10/2012 |
| WO | 2013/025336 | 2/2013 |

OTHER PUBLICATIONS

Aylett, B. J. et al., "Silicon-Nitrogen Compounds. Part V. Diphenylamino-derivatives of Silane," J. Chem. Soc. (A), Apr. 1969, pp. 636-638.

Aylett, B. J. et al., "Silicon-Nitrogen Compounds. Part VI.[1] The Preparation and Properties of Disilazane," J. Chem. Soc. (A), Apr. 1969, pp. 639-642.

Aylett, B. J. et al., "The Preparation and Some Properties of Disilylamine-Correspondence," Inorganic Chemistry, Jan. 1966, p. 167.

(56) References Cited

OTHER PUBLICATIONS

Beach, D. B., "Infrared and Mass Spectroscopic Study of the Reaction of Silyl Iodide and Ammonia. Infrared Spectrum to Silylamine," Inorganic Chemistry, Sep. 1992, pp. 4174-4177, vol. 31 No. 20.

Bowen, C., et al., "New Processing Techniques: Sweeping of Quartz Wafers and A Practical Method for Processing Quartz Resonators Under Controlled Conditions," Proceedings of the 1992 IEEE Frequency Control Symposium, pp. 648-656.

Burg, A. B. et al., "Silyl-Amino Boron Compounds," J. Amer. Chem. Soc., Jul. 1950, pp. 3103-3107, vol. 72.

Coltrin, M.E., et al., "Chemistry of AlGaN Particulate Formation," National Nuclear Security Administration, Physical, Chemical, & Nano Sciences Center, Research Briefs, 2005, pp. 42-43.

Davison, A. et al., "The Raman Spectra of Manganese and Rhenium Carbonyl Hydrides and Some Related Species," Inorganic Chemistry, Apr. 1967, pp. 845-847, vol. 6 No. 4.

Dussarrat, C. et al., "Low Pressure Chemical Vapor Deposition of Silicon Nitride Using Mono- and Disilylamine," Chemical Vapor Deposition XVI and EUROCVD 14 vol. 2 Proceedings of the International Symposium, Part of the 203rd Electrochemical Society Meeting in Paris France, Apr. 27-May 2, 2003, 11 pages.

Gulleri, G. et al., "Deposition Temperature Determination of HDPCVD Silicon Dioxide Films," 2005, Microelectronic Engineering, vol. 82, pp. 236-241.

International Search Report and Written Opinion of PCT/US2011/054635, mailed Jul. 9, 2012, 11 pages.

International Search Report and Written Opinion of PCT/US2011/054981, mailed May 9, 2012, 10 pages.

International Search Report and Written Opinion of PCT/US2011/054984, mailed May 11, 2012, 10 pages.

International Search Report and Written Opinion of PCT/US2011/066601, mailed Jul. 20, 2012, 10 pages.

Kang, H., "A Study of the Nucleation and Formation of Multi-functional Nanostructures using GaN-Based Materials for Device Applications," Georgia Institute of Technology, Doctor of Philosophy in the School of Electrical & Computer Engineering Dissertation, Dec. 2006, 187 pages.

Lee, E. G., et al., "Effects of Wet Oxidation on the Electrical Properties of sub-10 nm thick silicon nitride films", Thin Solid Films, Elsevier-Sequoia S.A. Lausanne, CH. vol. 205, No. 2, Dec. 1, 1991, pp. 246-251.

Loboda, M.J., et al., "Chemical influence of inert gas on the thin film stress in plasma-enhanced chemical vapor deposited a- SiN:H films". Journal of Materials Research, vol. 11, No. 2, Feb. 1996, pp. 391-398.

Lucovsky, G. et al., "Deposition of silicon dioxide and silicon nitride by remote plasma enhanced chemical vapor deposition," Journal of Vacuum Science & Technology, vol. 4, No. 3, May-Jun. 1986, pp. 681-688.

Norman, A. D. et al., "Reaction of Silylphosphine with Ammonia," Inoragnic Chemistry, Jun. 1979, pp. 1594-1597, vol. 18 No. 6.

Sujishi, S. et al., "Effect of Replacement of Carbon by Silicon in Trimethylamine on the Stabilities of the Trimethylboron Addition Compounds. Estimation of the Resonance Energy for Silicon-Nitrogen Partial Double Bond," Amer. Chem. Soc., Sep. 20, 1954, pp. 4631-4636, vol. 76.

Tsu, D. V. et al., "Silicon Nitride and Silicon Diimide Grown by Remote Plasma Enhanced Chemical Vapor Deposition", Journal of Vacuum Science and Technology: Part A, AVS/AIP, Melville, NY, US, vol. 4, No. 3, Part 01, May 1, 1986, pp. 480-485.

Ward, L. G. L. et al., "The Preparation and Properties of *Bis*-Disilanyl Sulphide and *Tris*-Disilanylamine," J. Inorg. Nucl. Chem., Dec. 1961, pp. 287-293, vol. 21, Pergamon Press Ltd., Northern Ireland.

Ward, L. G. L., "Bromosilane, Iodosilane, and Trisilylamine," Inorganic Syntheses, 1968, pp. 159-170, vol. 11.

Zuckerman, J.J., "Inorganic Reactions and Methods," Formation of Bonds to N, P, As, Sb, Bi (Part 1), ISBN-0-89573-250-5, Jan. 1998, 5 pages, vol. 7, VCH Publishers, Inc., New York.

International Search Report and Written Opinion of PCT/US2012/031640 mailed Oct. 18, 2012, 10 pages.

International Search Report and Written Opinion of PCT/US2012/039629, mailed Dec. 26, 2012, 6 pages.

International Search Report and Written Opinion of PCT/US2012/026786, mailed Jan. 2, 2013, 7 pages.

Franz, et al., "Conversion of silicon nitride into silicon dioxide through the influence of oxygen," Solid-State Electronics, Jun. 1971, pp. 449-505, vol. 14, Issue 6, Germany. Abstract Only.

International Search Report and Written Opinion of PCT/US2011/066275, mailed Sep. 24, 2012, 9 pages.

Tripp, et al., "The Anodic Oxidation of Silicon Nitride Films on Silicon," Journal of the Electrochemical Society, 1970, pp. 157-159, 117(2).

Usenko, et al., "Silicon Nitride Surface Conversion into Oxide to Enable Hydrophilic Bonding," ECS Meeting Abstracts, 2010, 1 page, Abstract #1716, 218th ECS Meeting.

* cited by examiner

LINER PROPERTY IMPROVEMENT

CROSS-REFERENCES TO RELATED APPLICATIONS

This application claims the benefit of U.S. Provisional Application No. 61/539,294, filed Sep. 26, 2011, and titled "LINER PROPERTY IMPROVEMENT." The entire contents of which are hereby incorporated by reference for all purposes.

BACKGROUND

Semiconductor manufacturing processes include many techniques for forming and isolating portions of the semiconductor substrate. One such process is the formation of through-silicon vias ("TSVs" or "vias") for 3D integration. These vias provide electrical connections vertically between stacked layers of an integrated circuit die. One benefit of vertical connections is the a shorter interconnect length as compared to horizontal interconnections, which can improve device speed. The vias may be made in several ways including via first, via middle, or via last, which indicate when in the chip processing the via is made. Via first describes the formation of vias during front-end fabrication in which the vias are often formed prior to the formation of a transistor. In via middle, or interconnect TSV, the metal-filled TSVs may be added after the transistor has been finished. For via last, the vias are formed on the device side of the substrate after CMOS/BEOL, and the substrate may be bonded to a carrier wafer for the via formation.

The vias are filled with a conductive material, such as copper or tungsten, and may include a liner layer or layers of a dielectric material to help insulate the conductor from the silicon substrate. As semiconductor devices continue to shrink in size and grow in complexity, the allowable tolerances for error within the devices shrink as well. If the metal is not properly insulated, it may migrate and potentially affect device performance with junction leakage or shift in threshold voltage. Thus, a liner layer capable of maintaining and controlling the metal becomes even more important. Moreover, with trenches that may be orders of magnitude larger than other types of trenches, adhesion and deposition issues with the liner layers may be presented that would not occur in smaller scale trenches, such as those formed during transistor processing. Another issue is with moisture inclusion in the liner. If the moisture escapes, the liner may be more porous, and again more prone to allowing metal migration. As vias continue to shrink in width along with the liner used, these problems may become amplified.

Thus, there is a continued need for improved liners and liner-formation techniques to contain the conductive material used in TSVs. These and other needs are addressed by the present technology.

BRIEF SUMMARY

The present technology provides methods of forming within a via, such as a via formed as part of a TSV structure, a thinner and more conformal liner than conventional liners that has additionally been doped for improved gettering capabilities. The liner layer may improve the control of the conductive material in the via, and provide improved dielectric constant values while maintaining the stress level and stability of the liner over time. The liner may include a bulk layer and a capping layer, depending on the thickness of the deposited material, and the doping may be incorporated in one or both of these layers. Previous attempts of lining a via with thin but doped layers have been insufficient due to the greater depth of vias as compared to other trenches or gaps produced in semiconductor manufacturing. These attempts have produced films with gaps in coverage or insufficient thickness across the liner. By incorporating a dopant within the liner matrix, better gettering properties can be seen along with reduced moisture migration. The depth of vias creates a greater difficulty in adhering the liner layer within the trench, which can cause an incomplete coverage along the via sidewall. Incomplete coverage can lead to gaps in the liner, which may cause shorting after a conductive material has been deposited in the trench. These issues can be increased when attempting to use a doped liner film which may show an increased adherence over undoped liner films.

Methods of forming a dielectric liner layer on a semiconductor substrate are described. The semiconductor substrate may include a field region, or the outer surface of the substrate and at least one via defined by sidewalls. The method may include flowing a phosphorus-containing precursor with a silicon-containing precursor and an oxygen-containing precursor over the substrate to deposit a dielectric material. The dielectric material may be deposited along the field region and within at least one via on the substrate. The method may also include forming a liner layer within the via with the dielectric material. The liner may include a silicon oxide doped with phosphorus. The sidewalls of the via may have an upper portion nearer to the field region, and a lower portion nearer to a bottom of the via. A first thickness of the liner layer at the upper portion of the via sidewall may be less than about 5 times a second thickness of the liner layer at the lower portion of the via sidewall.

Methods are also described for the forming of a doped dielectric layer on a semiconductor substrate, where the substrate has a field region and at least one via defined by sidewalls. The method may include flowing a silicon-containing precursor and an oxygen-containing precursor to form a bulk oxide layer within the at least one via. The method may also include flowing a silicon-containing precursor and an oxygen-containing precursor over the substrate to deposit a capping layer of dielectric material within the at least one via. The method may still further include forming a liner layer with the bulk oxide and capping layer within the via with the dielectric material, where the liner layer includes silicon oxide. The sidewalls of the via may have an upper portion nearer to the field region, and a lower portion nearer to a bottom of the via. A first thickness of the liner layer at the upper portion of the via sidewall may be less than about 5 times a second thickness of the liner layer at the lower portion of the via sidewall. The method may also include flowing a precursor containing a Group 15 element concurrently with the silicon-containing precursor and the oxygen-containing precursor during at least one or both of the forming the bulk oxide layer and the forming the capping layer.

Additional embodiments and features are set forth in part in the description that follows, and in part will become apparent to those skilled in the art upon examination of the specification or may be learned by the practice of the disclosed embodiments. The features and advantages of the disclosed embodiments may be realized and attained by means of the instrumentalities, combinations, and methods described in the specification.

BRIEF DESCRIPTION OF THE DRAWINGS

A further understanding of the nature and advantages of the disclosed embodiments may be realized by reference to the remaining portions of the specification and the drawings.

In the appended figures, similar components and/or features may have the same numerical reference label. Further, various components of the same type may be distinguished by following the reference label by a letter that distinguishes among the similar components and/or features. If only the first numerical reference label is used in the specification, the description is applicable to any one of the similar components and/or features having the same first numerical reference label irrespective of the letter suffix.

DETAILED DESCRIPTION

Methods of forming dielectric liner layers in through silicon via ("TSV") trenches are described. The methods may include depositing doped liner films that may include one, two, or more layers within the liner. The layers may be deposited along the walls of the TSV such that the thickness of the film near the top of the trench may be similar to the thickness of the film near the bottom of the trench.

TSVs allow vertical metal interconnections through thinned silicon substrates where both ends of the interconnect are accessible for contact. The exposed ends on each side of the substrate may be contacted with conductive materials such as micro-bumps or pillars, onto which companion chips may be stacked with upwards of eight or more chips. For example, TSVs formed through memory chips can allow several of these chips to be stacked. The TSVs run through each individual die composing the completed chip to provide the vertical interconnection paths, and then each die is connected with the next in the tier with micro-bumps, for example. Some benefits of such a packaging technique are that a more compact form factor may be produced in the resultant chips, and the reduced form factor can reduce the interconnect length between chips. The reduced interconnect length directly affects the device speed, and thus by reducing the length, the device speed can be improved.

Figure 1A:
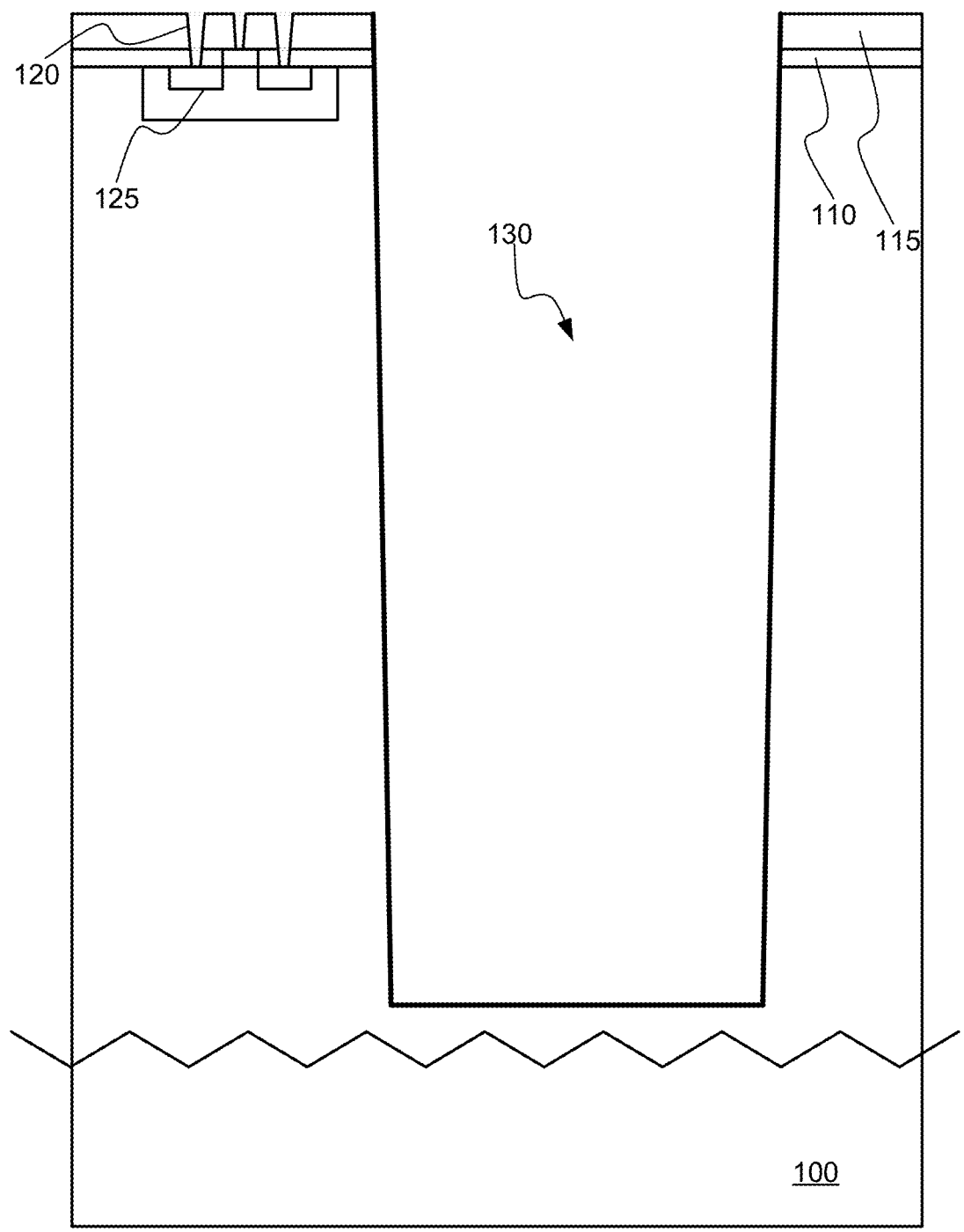
FIG. 1A shows an exemplary cross-sectional view of a processor die.
Figure 1B:
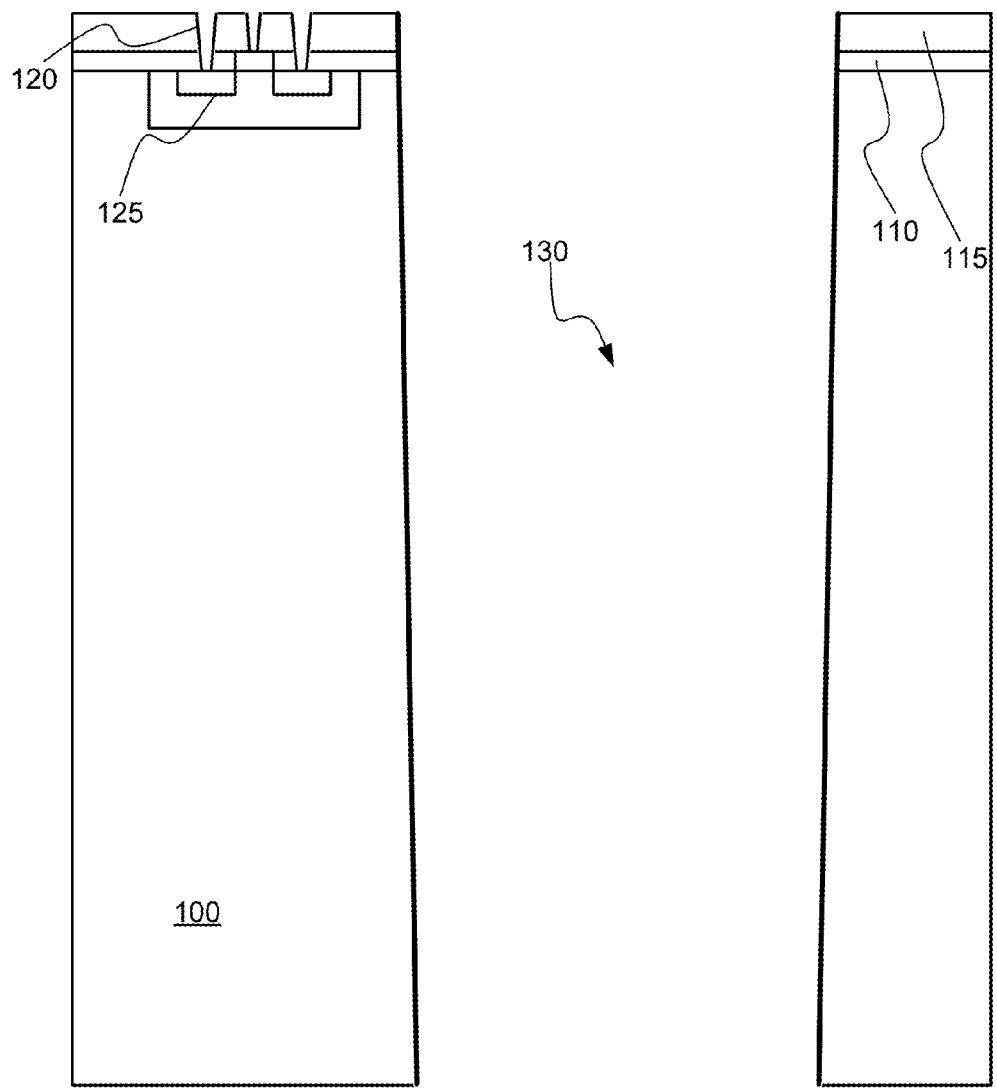
FIG. 1B shows another exemplary cross-sectional view of a processor die.

FIG. 1A shows an exemplary cross-section view of a substrate 100 on which certain features have been formed. FIG. 1A is intended to aid in understanding the differences between TSVs as compared to trenches and gaps utilized in transistor level features. FIG. 1A is not intended to limit the scope of the present technology in any way. A process has been performed on the substrate 100 similar to a via-middle approach to device manufacture in which the via is formed after transistor level processing. As shown, dielectric layers 110, 115 may be deposited prior to forming transistor features 125 and gaps 120. Gaps and trenches 120 formed during transistor processing may have widths of about 10 nm or less and heights of less than or about 100 nm. After transistor level processing has been performed, a via 130 may be etched into the substrate. The via may have a width of up to 5 μm or more, and a depth of up to 50 μm or more—distances that are two orders of magnitude or more and three orders of magnitude or more, respectively, than the minimum feature size of the transistors formed on the substrate. A barrier and/or liner layer may be deposited along the walls of the via prior to seeding with copper or a conductive metal. The via may be filled with copper or some other conductive metal to provide the interconnect through the wafer. Both transistor formation and TSV formation may include many more steps, with the formation of many more trenches and vias across the device. Further manufacturing steps may be performed including BEOL contact formation, deposition of interlayer dielectrics, and formation of chip-bonding sites (not shown). Thinning of the substrate wafer may be performed as shown in FIG. 1B to expose the back-side of the TSV so that the via extends all the way through the substrate to provide a contact point for electrical connection through the substrate.

Methods of forming a dielectric liner layer on a semiconductor substrate are described. The semiconductor substrate may include a field region and at least one via defined by sidewalls. The method may include flowing a phosphorus-containing precursor with a silicon-containing precursor and an oxygen-containing precursor over the substrate to deposit a dielectric material. The dielectric material may be deposited along the field region and within at least one via on the substrate. The method may also include forming a liner layer within the via with the dielectric material. The liner may include a silicon oxide doped with phosphorus. The sidewalls of the via may have an upper portion nearer to the field region, and a lower portion nearer to a bottom of the via. A first thickness of the liner layer at the upper portion of the via sidewall may be less than about 5 times a second thickness of the liner layer at the lower portion of the via sidewall.

Figure 2:
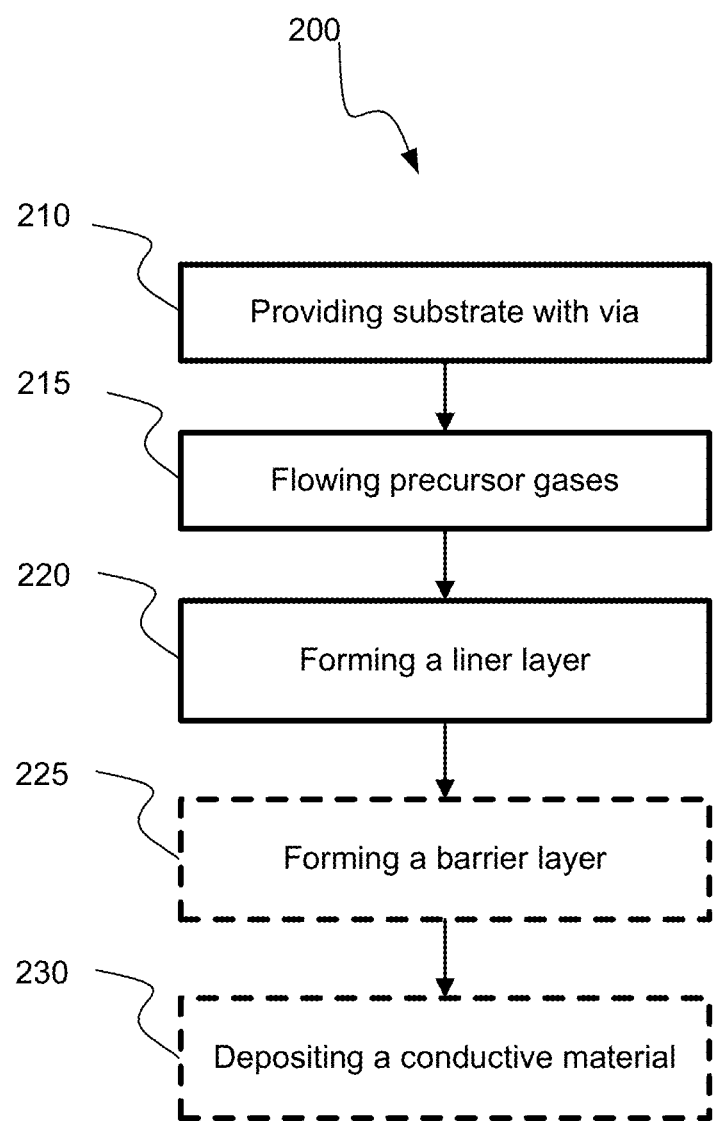
FIG. 2 shows a flowchart of a method of forming a dielectric liner according to disclosed embodiments.
Figure 4A:
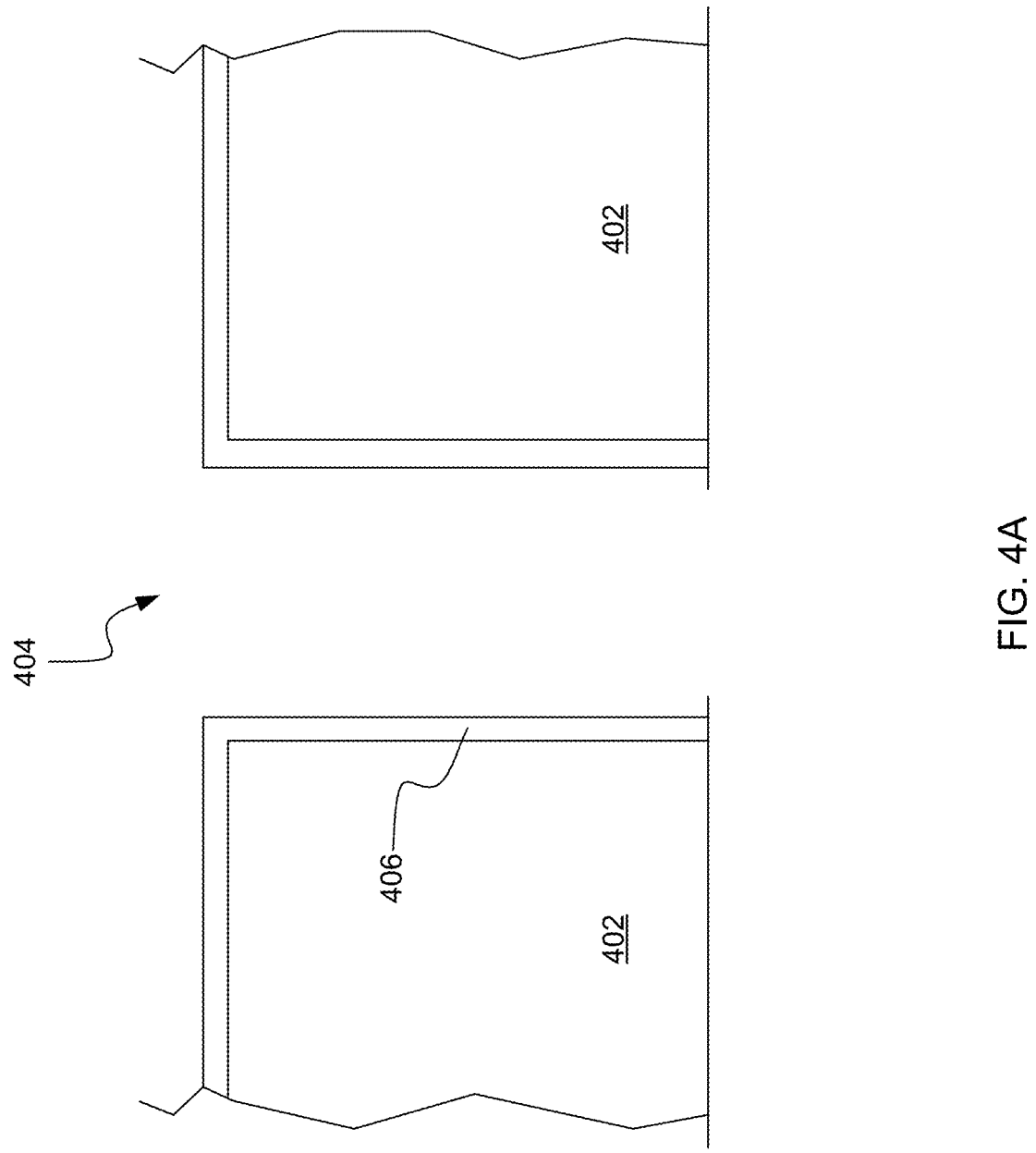
FIG. 4A shows a cross-sectional view of a substrate on which a dielectric liner according to disclosed embodiments has been formed.

Turning now to FIG. 2, a flowchart of a method 200 for forming a dielectric liner layer according to disclosed embodiments is shown. An exemplary substrate on which a liner has been deposited by the method according to FIG. 2 can be seen in FIG. 4A. FIG. 4A illustrates a cross-sectional view of such a substrate. A substrate is provided at step 210 on which a via has been etched. The substrate may be cleaned prior to the flowing of the precursor gases in order to remove any sodium, potassium, or other particles that may be incorporated into the chip and hinder performance. The method may be performed on a substrate used in a via first, via middle, or via last process as previously described. The via may be defined by sidewalls and a bottom such that the via has a width and height, defined by the aspect ratio of height:width. The bottom of the via may or may not technically exist depending on the type of TSV processing being performed. For example, in via first and via middle processing, a bottom of the via is defined by a portion of the substrate that will later be removed during the thinning of the substrate. On the other hand, via last may thin the substrate prior to forming vias and thus the part of the via opposite the field region may be open for IC layer stacking, and may not have a formed bottom. Regardless of the type of via processing, the term "bottom" when used refers to the end of the via opposite the field region of the substrate, or the position where via formation ends, and "field region" refers to the location where via formation is initiated. As seen in FIG. 4A, substrate 402 may be provided through which via 404 may be etched. Neither a bonded die that may exist below the graphic for a via last process, nor a bottom of the via located in the substrate for a via first process are shown in this figure for the purpose of clarity.

The via formed may have an aspect ratio greater than or about 5:1, and may alternatively have an aspect ratio greater than or about 10:1, greater than or about 15:1, greater than or about 20:1, etc., or more. After the substrate has been loaded into a deposition chamber, precursor gases may be flowed at step 215 into the chamber in order to form the liner layer at step 220. With TSV technology, although the technical ratio of the trench height:width may be comparable with other trenches, such as isolation trenches formed during transistor processing, the actual height and width dimensions may be much greater. For example, trenches that are filled in certain gapfilling technologies may have an aspect ratio of about 10:1, where the actual height and width are 100 nanometers and 10 nanometers respectively. TSV trenches, on the other hand, may be etched through the entirety of the substrate, and although may have an aspect ratio of 10:1, this ratio may be based on actual height and width values of about 50 μm and about 5 μm respectively, for example.

The via sidewalls may be further defined to include an upper portion and a lower portion of the sidewalls. The upper portion may be nearer to the field region of the semiconductor substrate, and the lower portion may be nearer to the bottom of the defined via. For example, the upper portion and lower portion may be based on a location as compared to the overall height of the via, where 0% would refer to the field area of the substrate or top of the via, 50% would define the location at the midline of the via, and 100% would define the bottom of the via. The upper portion may be any position above the midline of the via, and may be within a certain distance of the field region of the substrate. The upper portion may refer to a position anywhere between 0 and 50% of the via height, and may refer to a location within about 50%, about 40%, about 30%, about 20%, about 15%, about 12%, about 10%, about 8%, about 6%, about 5%, about 4%, about 3%, about 2%, or about 1% of the height of the field region of the substrate. Alternatively, the upper portion may refer to a location below the field region of the substrate at which the width of the liner layer may be thickest within the via.

Similarly, the lower portion may be any position below the midline of the via, and may be within a certain distance of the bottom of the via. The bottom portion may refer to a position anywhere between 50 and 100% of the via height, and may refer to a location lower than about 50%, about 60%, about 70%, about 75%, about 80%, about 85%, about 88%, about 90%, about 91%, about 92%, about 93%, about 94%, about 95%, about 96%, about 97%, about 98%, or about 99% of the height of the via. Alternatively, the lower portion may refer to a location above the bottom of the substrate at which the width of the liner layer may be thinnest within the via.

Various deposition processes may be used to form the liner layer at step 225, and may include thermal CVD techniques, such as sub-atmospheric CVD, or plasma CVD techniques, such as HDP CVD, among others. Sub-atmospheric CVD (SACVD) and related processes involve flowing a silicon-containing precursor and an oxygen-containing precursor into a semiconductor processing chamber at step 215, to form silicon oxide on the substrate. The silicon-containing precursor may include, for example, tetraethyl orthosilicate (TEOS) and the oxygen-containing precursor may include ozone ($O_3$), oxygen ($O_2$) and/or oxygen radicals. Various other gases may be used and may include silicon-and-nitrogen containing precursors. Other reactant(s) such as water vapor may be added to the substrate processing region during formation of an SACVD film as well, and may also include other carrier-type gases including $H_2$, $N_2$, He, and Ar, for example. Along with the silicon and oxygen-containing precursors, a phosphorus-containing precursor may be flowed across the substrate. The phosphorus-containing precursor may be triethylphosphate (TEPO), or may be phosphine ($PH_3$), diphosphine, $P_2H_6$, TMP, or another phosphorus-containing compound.

Although the title of the technique specifically includes the phrase sub-atmospheric, it should be noted that SACVD processes may occur close to or even above atmospheric pressures. The process pressures of the methods presented herein may be above or below atmospheric or ambient pressure. The pressure in the substrate processing chamber may also be about or below 700 Torr or 600 Torr during the deposition of the liner layer. Alternatively, the pressure in the processing chamber may be from about 10 to about 600 Torr. The temperature at which the substrate is held may be at or below about 600° C., about 500° C., about 400° C., etc., or less, and may be from about 100° C. to about 600° C. Alternatively, a plasma-enhanced deposition may be performed within an evacuated, or nearly evacuated processing chamber with a pressure at or below about 20 Torr. Depending on the type of via process being performed (e.g., via first or via middle or via last), the temperature of the processing chamber may be kept below a certain threshold in order to prevent damage to previously deposited materials. For example, in via middle and via last processing, transistor level production has already been performed. As a result, the temperature for subsequent processing including via formation and lining may be kept at or below about 400° C., for example, in order to prevent damage to previously deposited films.

The precursor gases may react to form a dielectric material that is deposited on the field region of the substrate and within the via. The dielectric material may form a more conformal liner layer within the via at step 220 than conventional techniques. Conformality refers to a deposited film layer having a uniform thickness on both horizontal and vertical surfaces, or a step coverage equal to about one. For many semiconductor processes utilizing trenches, such as those formed during transistor processing, the trench formed may be less than about 1 μm in width, or diameter, and may be less than about 50 nanometers, etc. or less. Through silicon vias, on the other hand, may be more than about 1 μm wide, and may alternatively be greater than about 2 μm, about 3 μm, about 4 μm, about 5 μm, etc., or more. Additionally, many trenches and gaps may be less than about 1 μm in height, and can routinely be about 100 nm or less. TSVs, on the other hand, may have heights greater than about 1 μm in height, or alternatively greater than about 5 μm, about 10 μm, about 20 μm, about 35 μm, about 50 μm, about 75 μm, 100 μm, etc., or more. Because the vias are so much deeper than conventional trenches, gases utilized for liners must travel a greater distance. When these gases deposit material, the deposition may occur preferentially towards the top of the via. Accordingly, if the thickness of the liner cannot be greater than a certain amount based on the amount of conductive material required, this thickness may be reached near the top of the via prior to when an adequate deposition has occurred in regions further down the via walls. If an insufficient amount of liner material is deposited along the via, the conductive material, such as copper, may diffuse through the liner corrupting the integrity of the device. As shown in FIG. 4A, a substantially conformal liner 406 may be deposited along the entire length of the via 404.

The liner may become partially thinner at the lower portions of via 404, while still providing gap-free coverage along the entirety of the via sidewall.

By more conformal in the context of through silicon vias is meant a liner layer in which the thinnest location is greater than about 20% of the thickness of the liner layer at the thickest location, while still having coverage along the entirety of the via, or having no gaps in the coverage. The deposited liner layer may be silicon oxide, and may include at least a portion of phosphorus substitutionally included within the silicon oxide matrix as a dopant. The amount of phosphorus included in the matrix may be from about 1% by weight to about 10% by weight. Alternatively the amount of phosphorus may be about 2%, about 4%, about 6%, or about 8% by weight of the deposited film. The liner layer may be deposited directly along the substrate, or alternatively may be deposited over a separate dielectric layer deposited within the via.

The thickness of the deposited film may be at all locations within the via between about 50 nanometers and about 500 nanometers. The thickness of the film may also be conformal or substantially conformal within the via in that a step coverage close to one is obtained. The thickness of the deposited liner layer at a lower portion or at the thinnest location within the via may be at least about 25% of the thickness of the deposited liner layer at an upper portion or at the thickest location within the via. The thickness at the thinnest location may be at least about 30%, about 35%, about 40%, about 45%, about 50%, etc., up to about 100% of the thickness at the thickest location within the via. The thickest amount of dielectric material may be deposited on the field region of the substrate, and the thickness of the liner layer at the lower portion or at the thinnest location within the via may be at least about 20% of the thickness of the dielectric material on the field region. The thickness at the thinnest location may alternatively be at least about 30%, about 35%, about 40%, about 45%, about 50%, etc., up to about 100% of the thickness at the thickest location on the field region, thus being conformal.

Conformality of films deposited in trenches may be a function of several variables including the aspect ratio of the trench, the type of film being deposited, and the residence time of the gases in the processing chamber. Films deposited in trenches other than TSV trenches may be able to access the entire trench at substantially similar times, and thus films deposited near the top of a trench in such trenches, may be of substantially similar thickness in comparison to the film as deposited near the bottom of the trench. In TSV trenches, however, there may be a delay between when film deposition occurs at the top of a trench and when film deposition occurs near the bottom of a trench. Accordingly, when a liner is deposited along a TSV trench, the thickness may be two, three, four, etc. or more times as thick near the top of the trench as it is near the bottom of the trench. This thickness disparity may be compounded when certain films are deposited. For example, doped films are likely to have more adherent properties than undoped films. Thus, a doped film is more likely to deposit nearer to the point that the precursor gases interact. Doped films deposited in transistor level trenches, such as those with nanometer dimensions, may not pose problems to conformality as the film is deposited in the entirety of the trench at substantially the same time. When such an adherent film is being deposited in a trench of many micrometers, such as a TSV, the film may deposit more preferentially near the top of the trench as soon as the particles interact with the substrate due to the increased level of adherence. Hence, the thickness of the film near the top of the trench may be even more than the thickness of the film near the bottom of the trench, when compared to other deposited films, such as undoped oxides, for example. However, the inventors have developed techniques described herein for depositing doped liner films along the entirety of a TSV that provides adequate coverage along the length of the via walls. Additionally, the deposited films maintain adequate step coverage, or conformality, such that the film deposited nearer to the top of the trench does not extend beyond a threshold thickness prior to adequate film formation nearer to the bottom of the trench.

After the oxide deposition has occurred, a barrier layer may be optionally formed at step 225. The barrier layer may be formed when certain conductive materials are utilized for the interconnection via fill material, such as copper, to help prevent copper diffusion into the silicon substrate, which can lead to device failure. However, when other fill materials are used (e.g. tungsten or polysilicon) a barrier may not be used. The diffusion barrier may include metals such as tantalum, tantalum nitride, titanium, titanium nitride, nickel, hathium, niobium, zirconium, tungsten, or ruthenium, for example, along with other transition metals, or transition metal oxides or nitrides. The diffusion barrier may also prevent metal migration into the substrate. The diffusion barrier may be deposited with CVD, or alternatively with a physical deposition or sputtering, pulsed-laser deposition, or other means of depositing an additional layer of material within the via.

After the barrier layer has been deposited, a conductive material may optionally be deposited in the via at step 230 to complete the electrical path between IC layers. The material deposited may be copper, tungsten, polysilicon, or some other material that may provide a sufficient electrical path between layers of the IC. The deposition may occur in one or more steps. For example, a copper seed layer may be deposited within the via to produce the structure required for the subsequent fill. After the seed layer has been grown or deposited, the via may be filled with the conductive material. Continuing the example, electrochemical deposition may be performed to deposit copper over the seed layer to fill the via. Additionally, optional fabrication steps may be performed subsequent to the via fill. For example, in a via middle process, BEOL processes as previously discussed may be performed prior to performing substrate thinning and packing steps and combining additional layers to the device that are electrically connected with the device with the interconnects contained in the vias. As seen in FIG. 4A, via 404 may be subsequently filled with a conductive material that may include copper, tungsten, polysilicon, etc., that is capable of providing electrical connections vertically through the substrate 402.

Figure 3:
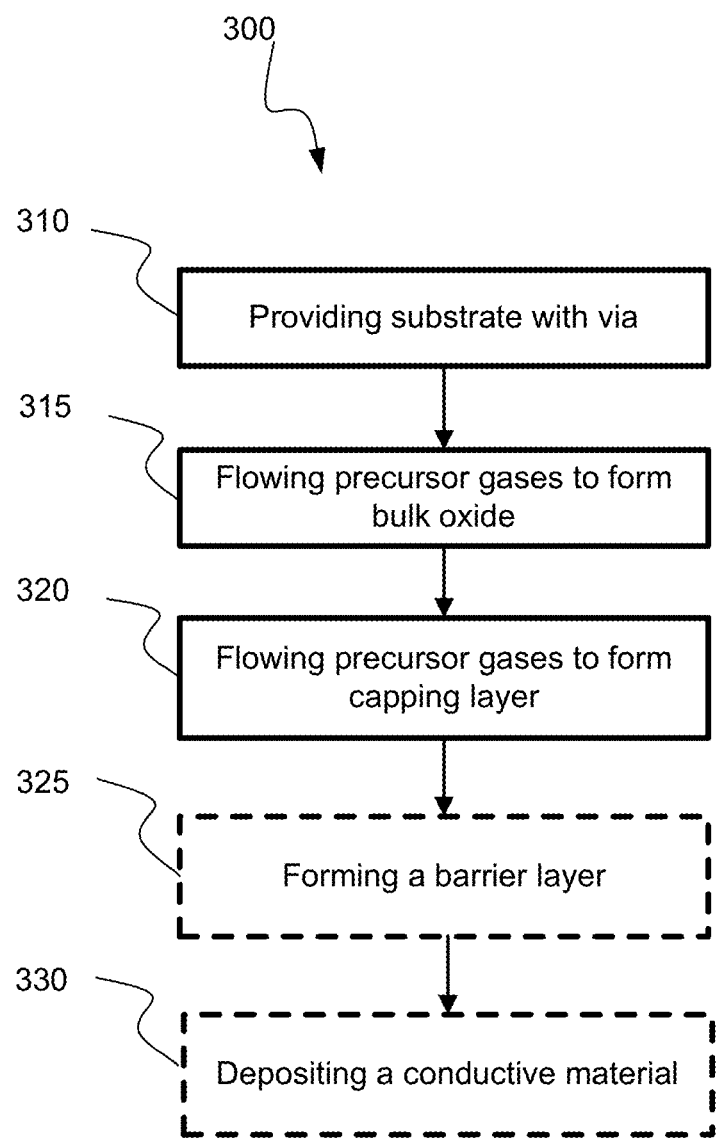
FIG. 3 shows a flowchart of a method of forming a dielectric liner according to disclosed embodiments.
Figure 4B:
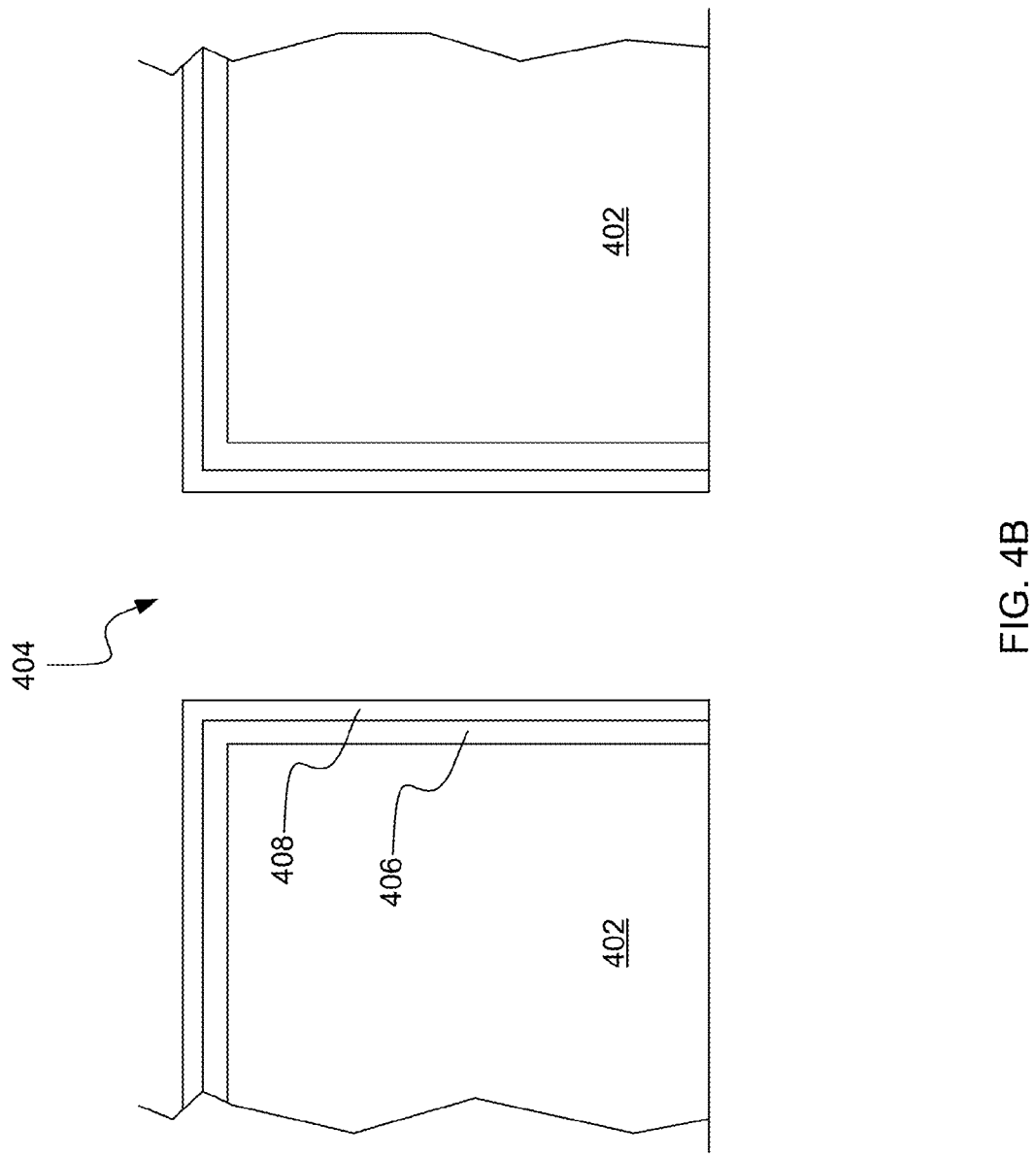
FIG. 4B shows a different cross-sectional view of a substrate on which a dielectric liner according to disclosed embodiments has been formed.

Turning now to FIG. 3, a flowchart of an alternative method 300 for forming a dielectric liner according to disclosed embodiments is shown in which multiple layers are deposited within the via. An exemplary substrate on which a liner has been deposited by the method according to FIG. 3 can be seen in FIG. 4B. FIG. 4B illustrates a cross-sectional view of such a substrate. The method may be performed in situations including when the via is thicker and can support multiple layers to the liner, or to provide additional thickness of dielectric material in order to prevent the conductive material in the via from migrating to the silicon substrate. A substrate is provided at step 310 on which at least one via has been etched. The substrate may be cleaned prior to the flowing of the precursor gases in order to remove any sodium, potassium, or other particles that may be incorporated into the chip and hinder performance. The method may be performed on a substrate used in a via first, via middle, or via last process as previously described. The via may be defined by sidewalls and a bottom such that the via has a width and height, that define an aspect ratio of height:width for the via. After the substrate has been loaded into the deposition chamber, precursor gases may be flowed at step 315 into the chamber in order to form a bulk oxide layer of the liner. As described previously, an optional barrier layer may be deposited within the via at step 325. As seen in FIG. 4B, substrate 402 may be provided through which via 404 may be etched. Neither a bonded die that may exist below the graphic for a via last process, nor a bottom of the via located in the substrate for a via first process are shown in this figure for the purpose of clarity.

The bulk oxide layer may be formed at step 315 by flowing a silicon-containing precursor and an oxygen-containing precursor into a semiconductor processing chamber to form silicon oxide on the substrate. The dielectric material that is formed may deposit along the field region of the substrate as well as within the via. The bulk oxide layer may be conformal or substantially conformal as it is grown on the substrate. The bulk oxide layer may be silicon dioxide, although a nitrogen containing precursor may be used in lieu of or with the oxygen containing precursor to form a nitride layer along with or alternative to the oxide layer. The pressure in the substrate processing chamber during the forming of the bulk layer or subsequent layers may be about or below 700 Torr or 600 Torr. Alternatively, the pressure in the processing chamber may be from about 10 Torr to about 600 Torr. The temperature at which the substrate is held may be at or below about 600° C., about 500° C., about 400° C. or less, and may be from about 100° C. to about 600° C. As shown in FIG. 4B, a substantially conformal oxide 406 may be deposited along the entire length of the via 404. The liner may become partially thinner at the lower portions of via 404, while still providing gap-free coverage along the entirety of the via sidewall.

A second dielectric layer may also be deposited within the via with the previous layer thereby creating a bulk layer of the liner and a capping layer for the liner. The same number, or a greater or fewer number of precursor gases may be flowed at step 320 to form a capping layer of the liner. The capping layer may be formed at step 320 by flowing a silicon-containing precursor and an oxygen-containing precursor over the semiconductor substrate in the same or a different manner as was used to form the bulk layer. For example, the capping layer may be formed by stopping the initial flow of precursor gases used to form the bulk oxide layer at step 315, and flowing a separate group of precursor gases to form the capping layer at step 320. Alternatively, one or both of the silicon-containing precursor and oxygen-containing precursor may be continuously flowed, but one or more additional precursor gases may be flowed over the substrate to promote different structures or properties within the capping layer. In another alternative, one or more process chamber parameters may be changed in conjunction with either of the previous examples during the forming of the capping layer. These parameters may include, without limiting the parameters that may be changed, the pressure within the chamber, the temperature of the substrate, the flow rates of the precursor gases, the amount of plasma generation within the chamber, whether plasma is utilized to excite precursor gases prior to their entering the process chamber, etc. The second layer can be seen in FIG. 4B as deposited layer 408. As with bulk oxide layer 406, the layer may form along the entirety of the via sidewall.

The two layers may be of the same or of a different quality. Additionally, one or both of the layers may include a dopant incorporated into the film, such as a phosphorus dopant. For example, a phosphorus-containing precursor may be flowed with the silicon and oxygen-containing precursors in order to dope the bulk oxide layer and/or capping layer. The amount of doping of the bulk oxide layer may be the same amount of doping as the capping layer, or may be more or less than the amount of doping in the capping layer. The amount of doping in each layer may be based on the thickness of the layer in order to control counter-doping of the substrate, or to create specific gettering properties at particular depths of the liner. For example, either portion of the liner may remain undoped while the other portion is doped. Alternatively, both the bulk oxide and capping layer of the liner may have a similar amount of doping, such as for example, 2% or 4% phosphorus incorporation within the layer. In still another alternative, a differing amount of dopant may be incorporated within each layer, such as 4% within the bulk oxide, and 2% within the capping layer, or vice versa, etc. Many such combinations can be produced within the scope of the technology discussed herein. As still another example, the doped portion may be part of the bulk oxide that is sandwiched between two undoped portions. In this way, part of the bulk oxide may be initially deposited undoped, followed by a portion that is deposited with doping. Subsequently, a capping layer can be deposited to complete the layer. By providing both an undoped portion of the lining layer and a doped portion of the lining layer, added benefits may be realized. As discussed above, the dopant may affect the step coverage of the film reducing the overall conformality. By utilizing both undoped as well as doped portions, better conformality may be realized, and hence better integration may occur. With the improved step coverage from the hybrid doped and undoped layers, less of a barrier layer may be needed and there may be a lower rate of failure due to shorting. In this way, the combined benefits of improved step coverage from the undoped portion as well as the gettering from the doped portion may both be provided. As seen in FIG. 4B, two dielectric layers have been formed as a liner for the via and include a bulk layer 406 and a capping layer 408. Either one or both of the bulk layer 406 or the capping layer 408 may be doped with a gettering agent that may include phosphorus, for example.

As an optional step, either or both of the bulk layer and capping layer may be etched within the process 300. For example, after the bulk layer has been deposited, the flow of the precursor gases may be stopped, and an etching process may be performed to reduce the thickness of the bulk layer. The etching may be isotropic or anisotropic and may be performed using a plasma inside the chamber to excite etchant gases, or by using a liquid etching solution. Additionally, if etchant gases are used, the etchants may be excited in a remote plasma region prior to their entering the processing chamber. Similarly, after the capping layer has been formed, an etching process may be performed to reduce the thickness of the capping layer as well.

The liner may be formed as a combination of the bulk layer and the capping layer deposited at steps 315 and 320. The liner may be conformal or substantially conformal within the via on the sidewalls and bottom. The via sidewalls may be further defined to include an upper portion and a lower portion of the sidewalls. The upper portion may be nearer to the field region of the semiconductor substrate, and the lower portion may be nearer to the bottom of the defined via. The liner may have a first thickness at the upper portion of the via sidewall that is less than about 5 times a second thickness of the liner at the lower portion of the via sidewall.

The overall thickness of the liner may be between about 50 nm and 500 nm at all locations along the via, or between about 100 nm and about 300 nm. Alternatively, the thickness may be less than about 50 nm, or greater than 500 nm, or less than or about 450 nm, about 400 nm, about 300 nm, about 200 nm, about 150 nm, about 100 nm, etc. or less. The thickness of the deposited liner at a lower portion or at the thinnest location within the via may be at least about 25% of the thickness of the deposited liner at an upper portion or at the thickest location within the via. The thickness at the thinnest location may be at least about 30%, about 35%, about 40%, about 45%, about 50%, etc., up to about 100% of the thickness at the thickest location within the via. The thickest amount of dielectric material may be deposited on the field region of the substrate, and the thickness of the liner at the lower portion or at the thinnest location within the via may be at least about 20% of the thickness of the dielectric material on the field region. The thickness at the thinnest location may be at least about 30%, about 35%, about 40%, about 45%, about 50%, etc., up to about 100% of the thickness at the thickest location on the field region, thus being completely conformal.

During the flowing of the precursor gases to form the bulk layer and/or the flowing of the precursor gases to form the capping layer, a precursor containing boron or a Group 15 element may be flowed over the substrate to create a layer of dielectric material that is doped with boron or a Group 15 element. The Group 15 element may be any element within that group including phosphorus and arsenic. Alternatively, any other precursor may be used that contains a doping element that will substitutionally incorporate within the lattice structure of the dielectric layer to provide sites of a local negative charge for the benefit of gettering. A precursor containing a doping element that will be contained within the lattice structure to create islands of local negative charge may also be used. The precursor may be, in one example, triethylphosphate (TEPO) or phosphine.

As previously discussed, the precursor containing boron or a Group 15 element may be flowed during one or both of the forming of the bulk oxide layer and the capping layer. The precursor may be flowed during the forming of the bulk layer, but not during the forming of the capping layer in order to dope the bulk layer while leaving the capping layer undoped. Alternatively, the precursor may be flowed during the forming of the capping layer, but not during the forming of the bulk layer in order to dope the capping layer while leaving the bulk layer undoped. The precursor may also be flowed during both the forming of the bulk layer and the capping layer in order to dope both layers so that the formed liner is doped throughout the entire width. After the liner layer has been formed within the via, additional manufacturing steps may be performed, and optionally, a barrier layer may be formed at step 325, and a conductive material may be deposited within the via at step 330 as described previously with reference to FIG. 2.

EXAMPLES

Comparative examples were made between silicon oxide liners formed using a phosphorus dopant, and liners formed with varying dielectric materials. The liners were deposited using one or both of SACVD and plasma enhanced CVD, and then tested for quality both as deposited as well as one day later. A method of estimating mobile ion movement may include evaluating the moisture content and the dielectric constant for the liner. As can be seen in Table I below, the liner layer including a 4 weight percent doped liner had a lower dielectric constant. The dielectric constant can be used as an estimate of how well the film will perform in gettering, and the lower the dielectric constant, the better the film may perform. Additionally, the stress development of the film over one day indicates the stability of the doped layers and the ability of the layers to maintain any moisture deposited with the film. When films are deposited at lower temperatures, such as at about 400° C., in order to account for materials previously deposited in other manufacturing steps, a certain amount of moisture may be included in the film. Should this moisture escape, the deposited film may become more porous, and weaker, and the moisture that may escape into the substrate may damage device performance. Weaker films are more likely to allow diffusion of copper or other conductive materials into the substrate which may increase device failure. This issue can be compounded in TSVs in which the film may have reduced thickness at certain locations due to the poorer deposition performance that may occur when depositing films in such deep vias. Accordingly, as seen below, the inventors have been able to produce a film with improved gettering characteristics that does not materially reduce the effective stress level of the film. As such, the doped liner layer was able to improve the K value of the film, without detrimentally affecting the stress level of the film.

TABLE I

DOPED OXIDE QUALITY

|  | K value | Film Stress as Deposited (Mpa) | Film Stress One Day Later (Mpa) |
| --- | --- | --- | --- |
| Undoped Oxide | 4.39 | 108.8606 | 107.1329 |
| PSG | 4.19 | 134.9133 | 135.5647 |

Figure 5:
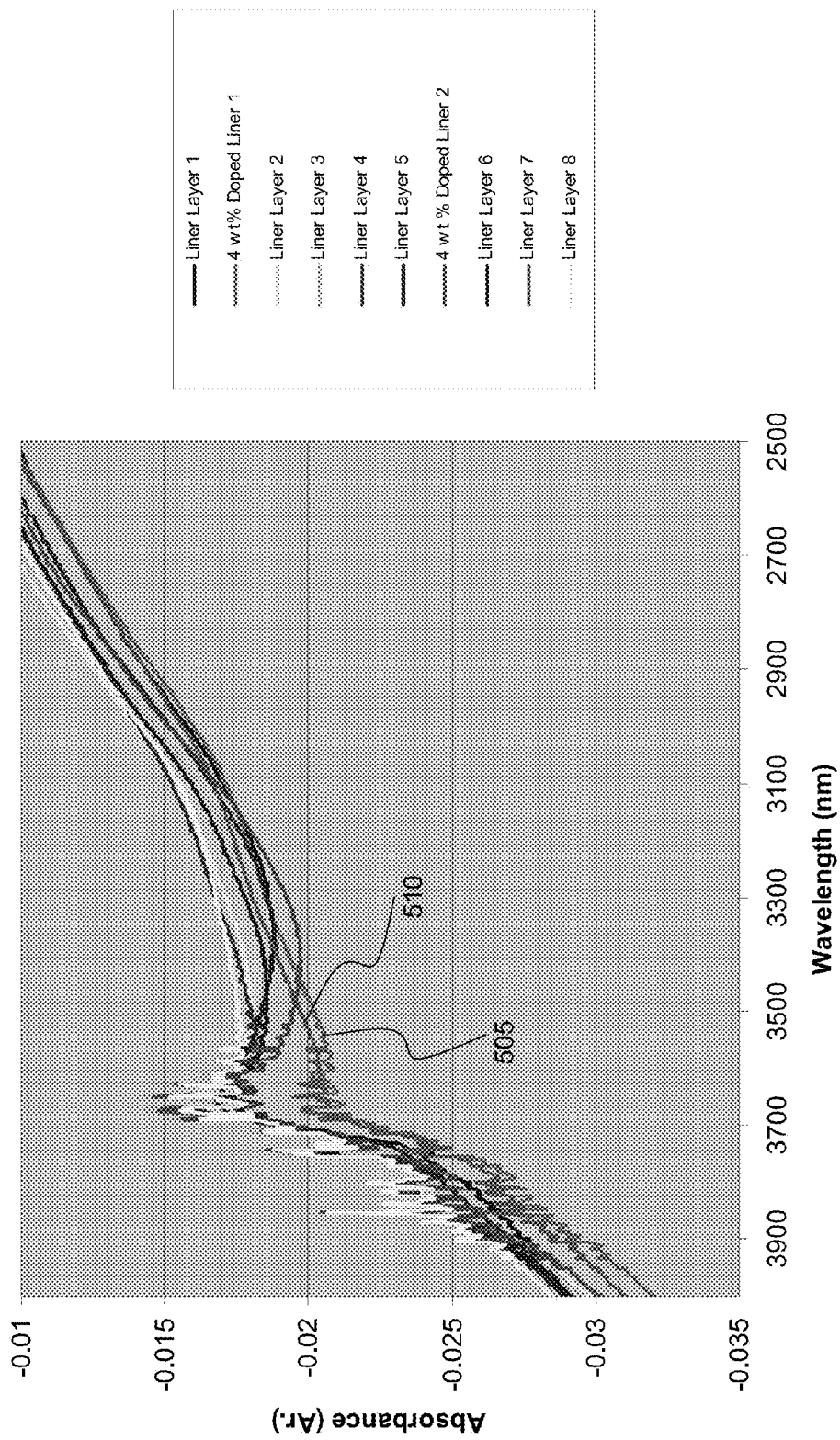
FIG. 5 shows a plot of Fourier transform infrared spectroscopy measurements taken from various dielectric liner layers.

The comparative examples also included Fourier transform infrared spectroscopy measurements of the deposited liner layers as shown in FIG. 5. The spike in the measurements slightly above the 3700 nm wavelength indicates the amount of moisture incorporated in the film. The measurement lines showing the least amount of water absorbance are the liner doped with 4 weight percent phosphorus as deposited 505, as well as the same liner measured one day after deposition 510. These measurements indicate not only that the deposited liner absorbed less moisture within the cage structure of the liner, but also that after deposition the amount of additional water incorporated within the liner was minimized as well.

Figure 6A:
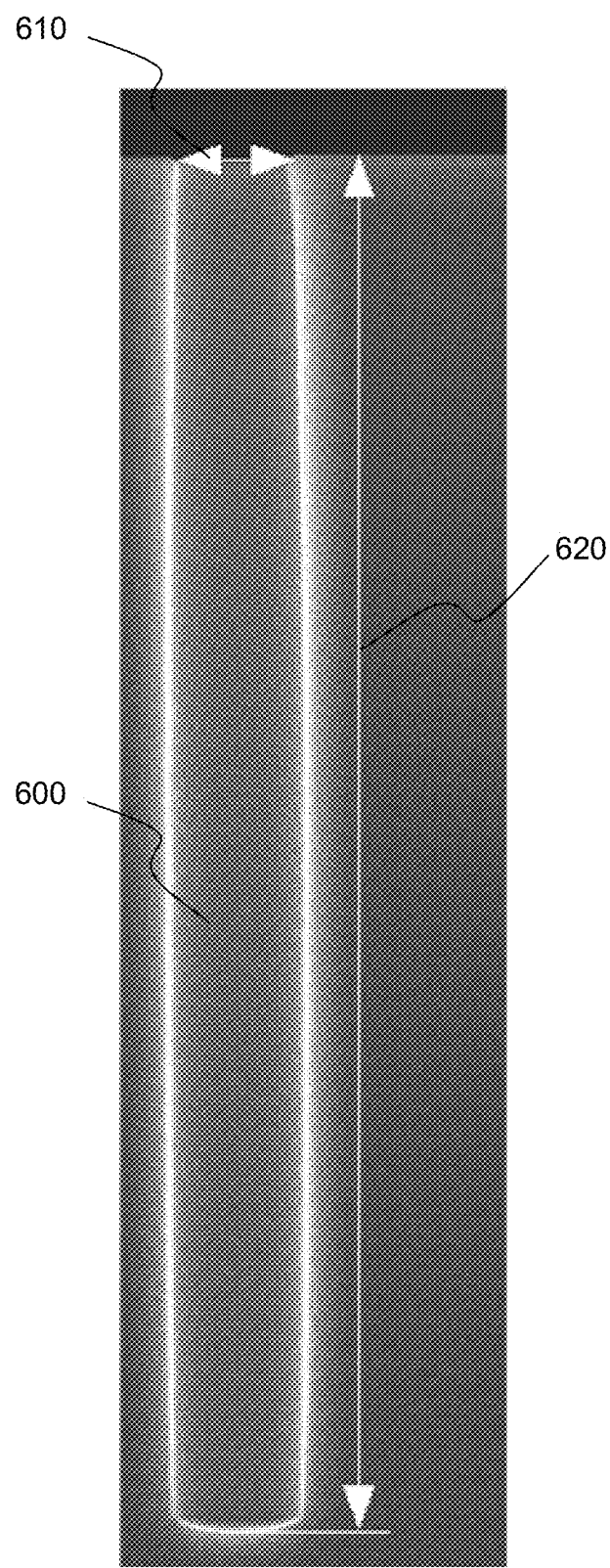
FIG. 6A shows an SEM image of a substrate on which a dielectric liner layer according to disclosed embodiments was formed.
Figure 6B:
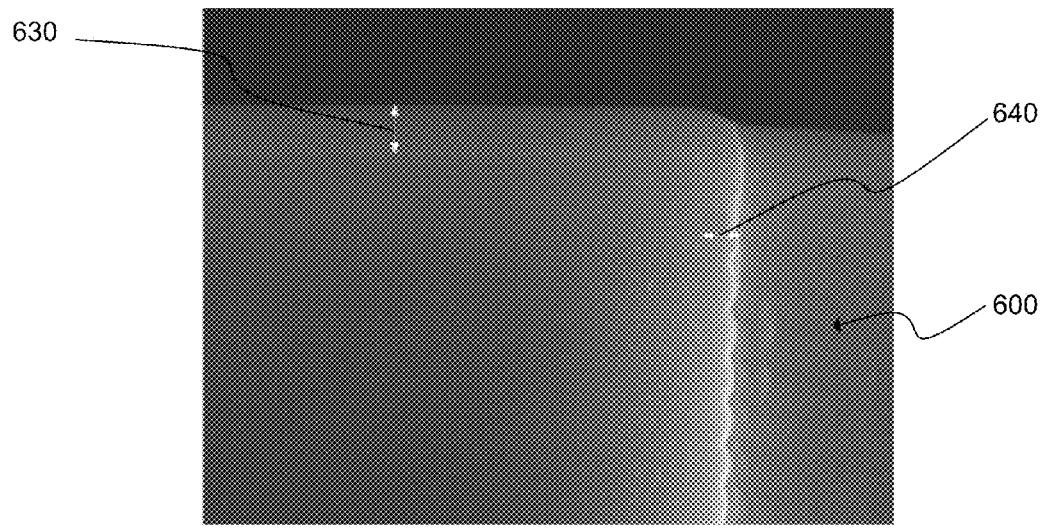
FIG. 6B shows another SEM image of a substrate on which a dielectric liner layer according to disclosed embodiments was formed.
Figure 6C:
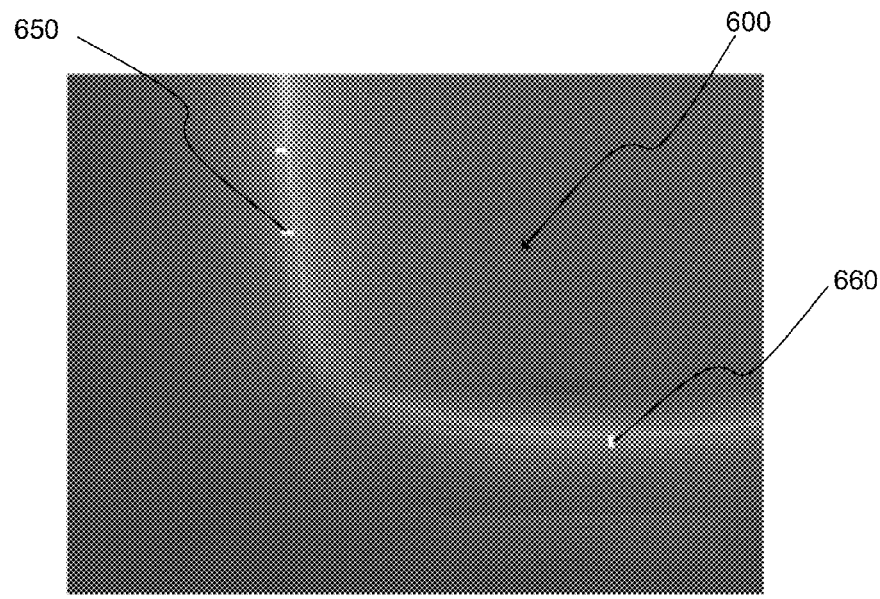
FIG. 6C shows still another SEM image of a substrate on which a dielectric liner layer according to disclosed embodiments was formed.

FIG. 6A shows an SEM image of a substrate on which a dielectric liner layer according to disclosed embodiments was formed. Via 600 etched in a semiconductor substrate is defined by width 610 and height 620. A dielectric liner layer was formed along the sidewalls and bottom of the via, as can be seen in close-up in FIGS. 6B and 6C. FIG. 6B shows a close-up image of via 600 at the top of the via, i.e. at the field region of the substrate. The deposited liner layer has a thickness 630 along the field region, which may be the thickest area of deposition of the material. The deposited liner layer has a thickness 640 at an upper portion of the via near the field region that may be less thick than the deposited liner layer along the field region. The thickness 640 of the liner layer at the upper portion of the via may be thicker than the liner layer at any other location within the via. FIG. 6C shows a close-up image of via 600 at the bottom of the via. The deposited liner layer has a thickness 660 at the bottom of the via, and a thickness 650 at a lower portion along the sidewall, which may be one of the thinnest areas of deposition of the material. The thickness of the deposited liner layer 650 at the lower portion along the sidewall is more than 25% the thickness of the deposited liner layer along the field region of the semiconductor substrate.

In the preceding description, for the purposes of explanation, numerous details have been set forth in order to provide an understanding of various embodiments of the present invention. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the disclosed embodiments. Additionally, a number of well known processes and elements have not been described in order to avoid unnecessarily obscuring the present invention. Accordingly, the above description should not be taken as limiting the scope of the invention.

It is noted that individual embodiments may be described as a process which is depicted as a flowchart, a flow diagram, or a block diagram. Although a flowchart may describe the method as a sequential process, many of the operations may be performed in parallel or concurrently. In addition, the order of the operations may be rearranged. A process may be terminated when its operations are completed, but could have additional steps not discussed or included in a figure. Furthermore, not all operations in any particularly described process may occur in all embodiments. A process may correspond to a method, a function, a procedure, a subroutine, a subprogram, etc. When a process corresponds to a function, its termination corresponds to a return of the function to the calling function or the main function.

Where a range of values is provided, it is understood that each intervening value, to the smallest fraction of the unit of the lower limit, unless the context clearly dictates otherwise, between the upper and lower limits of that range is also specifically disclosed. Each smaller range between any stated value or intervening value in a stated range and any other stated or intervening value in that stated range is encompassed. The upper and lower limits of those smaller ranges may independently be included or excluded in the range, and each range where either, neither, or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a dielectric material" includes a plurality of such materials, and reference to "the application" includes reference to one or more applications and equivalents thereof known to those skilled in the art, and so forth.

Also, the words "comprise", "comprising", "include", "including", and "includes", when used in this specification and in the following claims, are intended to specify the presence of stated features, integers, components, or steps, but they do not preclude the presence or addition of one or more other features, integers, components, steps, acts, or groups.

What is claimed is:

1. A method of processing a semiconductor substrate having a field region and at least one via defined by sidewalls and having a depth greater than 1 µm, the method comprising:
depositing a lining layer comprising silicon, oxygen, and phosphorus and having a varying thickness of between about 50 nm and about 500 nm along the sidewalls of the via such that a first thickness of the liner layer at an upper portion of the via sidewall is less than about 5 times a second thickness of the liner layer at a lower portion of the via sidewall.

2. The method of claim 1, wherein the phosphorus is deposited from a precursor comprising triethylphosphate (TEPO) or phosphine.

3. The method of claim 1, wherein the amount of phosphorus in the lining layer is 4 percent by weight.

4. The method set forth in claim 1, wherein the lining layer includes a bulk layer and a capping layer at least one of which is a phosphorus-doped silicon oxide layer.

5. The method of claim 1, further comprising depositing a barrier layer after the lining layer.

6. The method of claim 1, wherein the thickness of the lining layer is between about 100 nanometers and about 200 nanometers at all locations along the liner layer within the at least one via.

7. The method of claim 1, wherein the thickness of the lining layer at the lower portion of the via sidewall is at least about 20% of the thickness of the deposited material on the field region of the semiconductor substrate.

8. The method of claim 1, wherein the thickness of the lining layer at the lower portion of the via sidewall is at least about 25% of the thickness of the deposited material in the field region of the semiconductor substrate.

9. The method of claim 1, wherein the thickness of the lining layer at the lower portion of the via sidewall is at least about 30% of the thickness of the lining layer at the upper portion of the via sidewall.

10. The method of claim 1, wherein the forming of the lining layer is performed at a temperature that is less than or about 400° C.

11. A method of forming a through-silicon via structure (TSV) on a semiconductor substrate, the method comprising:
providing the semiconductor substrate having a plurality of transistors with a minimum feature size formed thereon and at least one via defined by sidewalls, the at least one via having a width that is at least two orders of magnitude greater than the minimum feature size of the transistors and a depth that is at least three orders of magnitude greater than the minimum feature size; and
depositing a lining layer comprising silicon, oxygen, and phosphorus and having a varying thickness of between about 50 nm and about 500 nm along the sidewalls of the via such that a first thickness of the liner layer at an upper portion of the via sidewall is less than about 5 times a second thickness of the liner layer at a lower portion of the via sidewall.

12. The method of claim 11, wherein the lining layer includes a bulk layer and a capping layer at least one of which is a phosphorus-doped silicon oxide layer.

13. The method of claim 12, wherein the bulk layer is doped with phosphorus, but the capping layer is not.

14. The method of claim 12, wherein the capping layer is doped with phosphorus, but the bulk oxide layer is not.

15. The method of claim 11, wherein the phosphorus is deposited using triethylphosphate (TEPO).

16. The method of claim 11, wherein forming the lining layer occurs at a temperature of the semiconductor substrate that is less than or about 400° C.

17. The method of claim 11, wherein forming the lining layer also deposits material on the field region of the semiconductor substrate, and wherein the thickness of the lining layer at the lower portion of the via sidewall is at least about 25% of the thickness of the deposited material in the field region of the semiconductor substrate.

18. The method of claim 11, wherein the thickness of the lining layer at the lower portion of the via sidewall is at least about 30% of the thickness of the lining layer at the upper portion of the via sidewall.

19. The method of claim 11, wherein the thickness of the lining layer is between about 100 nanometers and about 200 nanometers at all locations along the liner layer within the at least one via.

20. The method of claim 11, wherein the amount of doping in the lining layer is about 2 percent by weight or about 4 percent by weight, or at some percentage there between.

* * * * *